(12) United States Patent
Koduri

(10) Patent No.: US 10,957,666 B2
(45) Date of Patent: Mar. 23, 2021

(54) PRE-MOLDED LEADFRAMES IN SEMICONDUCTOR DEVICES

(71) Applicant: TEXAS INSTRUMENTS INCORPORATED, Dallas, TX (US)

(72) Inventor: Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/151,026

(22) Filed: Oct. 3, 2018

(65) Prior Publication Data
US 2019/0109076 A1   Apr. 11, 2019

Related U.S. Application Data

(60) Provisional application No. 62/568,330, filed on Oct. 5, 2017, provisional application No. 62/568,331, filed (Continued)

(51) Int. Cl.
*H01L 23/00* (2006.01)
*H01L 23/31* (2006.01)
(Continued)

(52) U.S. Cl.
CPC .......... *H01L 24/16* (2013.01); *H01L 21/4828* (2013.01); *H01L 21/565* (2013.01);
(Continued)

(58) Field of Classification Search
CPC ... H01L 2224/0345; H01L 2224/03452; H01L 2224/0401; H01L 2224/05147;
(Continued)

(56) References Cited

U.S. PATENT DOCUMENTS 6,559,527 B2   5/2003   Brofman et al.
6,780,746 B2   8/2004   Kinsman et al.
(Continued)

FOREIGN PATENT DOCUMENTS

RU       2035086 C1    10/1995

OTHER PUBLICATIONS

PCT International Search Report for International Application No. PCT/US 2018/054517, dated Jan. 31, 2019, 2 pages.
(Continued)

*Primary Examiner* — Jasmine J Clark
(74) *Attorney, Agent, or Firm* — Dawn Jos; Charles A. Brill; Frank D. Cimino

(57) ABSTRACT

In one instance, a semiconductor package includes a metal leadframe having a first plurality of openings extending partially into the leadframe from the first side and a second plurality of openings extending partially into the leadframe from the second side together forming a plurality of leads. A pre-mold compound is positioned in the second plurality of openings that at least partially supports the plurality of leads. The semiconductor package has a plurality of bumps extending from the landing sites to a semiconductor die and a molding compounding at least partially covering the plurality of bumps and the metal leadframe. Other packages and methods are disclosed.

21 Claims, 12 Drawing Sheets

Related U.S. Application Data on Oct. 5, 2017, provisional application No. 62/568,333, filed on Oct. 5, 2017.

(51) Int. Cl.
*H01L 23/495* (2006.01)
*H01L 21/48* (2006.01)
*H01L 21/56* (2006.01)

(52) U.S. Cl.
CPC ...... *H01L 23/3114* (2013.01); *H01L 23/3121* (2013.01); *H01L 23/3157* (2013.01); *H01L 23/495* (2013.01); *H01L 23/49541* (2013.01); *H01L 23/49548* (2013.01); *H01L 23/49558* (2013.01); *H01L 23/49586* (2013.01); *H01L 24/13* (2013.01); *H01L 24/17* (2013.01); H01L 23/4951 (2013.01); H01L 23/49562 (2013.01); H01L 24/03 (2013.01); H01L 24/05 (2013.01); H01L 24/11 (2013.01); H01L 24/81 (2013.01); H01L 2224/0345 (2013.01); H01L 2224/03452 (2013.01); H01L 2224/03912 (2013.01); H01L 2224/0401 (2013.01); H01L 2224/05147 (2013.01); H01L 2224/05666 (2013.01); H01L 2224/1111 (2013.01); H01L 2224/1147 (2013.01); H01L 2224/11622 (2013.01); H01L 2224/13012 (2013.01); H01L 2224/13013 (2013.01); H01L 2224/13014 (2013.01); H01L 2224/13016 (2013.01); H01L 2224/13082 (2013.01); H01L 2224/13111 (2013.01); H01L 2224/13147 (2013.01); H01L 2224/16055 (2013.01); H01L 2224/16058 (2013.01); H01L 2224/16245 (2013.01); H01L 2224/16501 (2013.01); H01L 2224/1703 (2013.01); H01L 2224/17515 (2013.01); H01L 2224/32245 (2013.01); H01L 2224/73204 (2013.01); H01L 2224/81801 (2013.01); H01L 2224/94 (2013.01); H01L 2924/014 (2013.01); H01L 2924/0105 (2013.01); H01L 2924/01047 (2013.01); H01L 2924/3656 (2013.01)

(58) Field of Classification Search
CPC ... H01L 2224/05666; H01L 2224/1147; H01L 2224/13013; H01L 2224/13014; H01L 2224/13016; H01L 2224/13082; H01L 2224/13111; H01L 2224/1703; H01L 2224/32245; H01L 2224/73204; H01L 2224/94; H01L 2224/03912; H01L 2224/13012; H01L 23/4951; H01L 23/49562; H01L 23/3114; H01L 23/495; H01L 24/81; H01L 23/49541; H01L 23/49558; H01L 23/49586; H01L 2224/81801; H01L 24/11; H01L 2224/16245; H01L 2224/16058; H01L 2224/13147; H01L 2224/16501; H01L 2224/16055; H01L 2224/17515; H01L 2224/1111; H01L 2924/01047; H01L 2924/0105; H01L 24/13; H01L 2924/014; H01L 2924/3656; H01L 24/17; H01L 24/16; H01L 21/4826; H01L 23/3121; H01L 2224/16; H01L 21/561; H01L 23/49548; H01L 21/565; H01L 2224/81; H01L 2224/17415; H01L 24/03; H01L 23/3157; H01L 23/449541; H01L 2924/00; H01L 2224/11622

See application file for complete search history.

(56) References Cited

U.S. PATENT DOCUMENTS

| | | | |
|---|---|---|---|
| 7,045,893 B1 | 5/2006 | Paek et al. | |
| 7,329,957 B2 | 12/2008 | Sakano et al. | |
| 8,551,820 B1* | 10/2013 | Foster | H01L 23/49582 |
| | | | 438/123 |
| 8,993,376 B2 | 3/2015 | Camacho et al. | |
| 9,219,025 B1* | 12/2015 | Lee | H01L 23/49503 |
| 9,337,154 B2 | 10/2016 | Miao et al. | |
| 2007/0132047 A1 | 6/2007 | Kuisma et al. | |
| 2011/0111562 A1 | 5/2011 | San Antonio et al. | |
| 2012/0068334 A1 | 3/2012 | Migita et al. | |
| 2016/0172277 A1* | 6/2016 | Lee | H01L 23/49861 |
| | | | 257/676 |
| 2016/0322322 A1 | 11/2016 | Utsunomiya | |

OTHER PUBLICATIONS

Patent Cooperation Treaty Search Report, PCT/US2018/054392, dated Jan. 24, 2019, 3 pages.
HotRod QFN Package PCB Attachment, Texas Instruments, Application Report, SLUA715—May 2014, 11 pages.

* cited by examiner

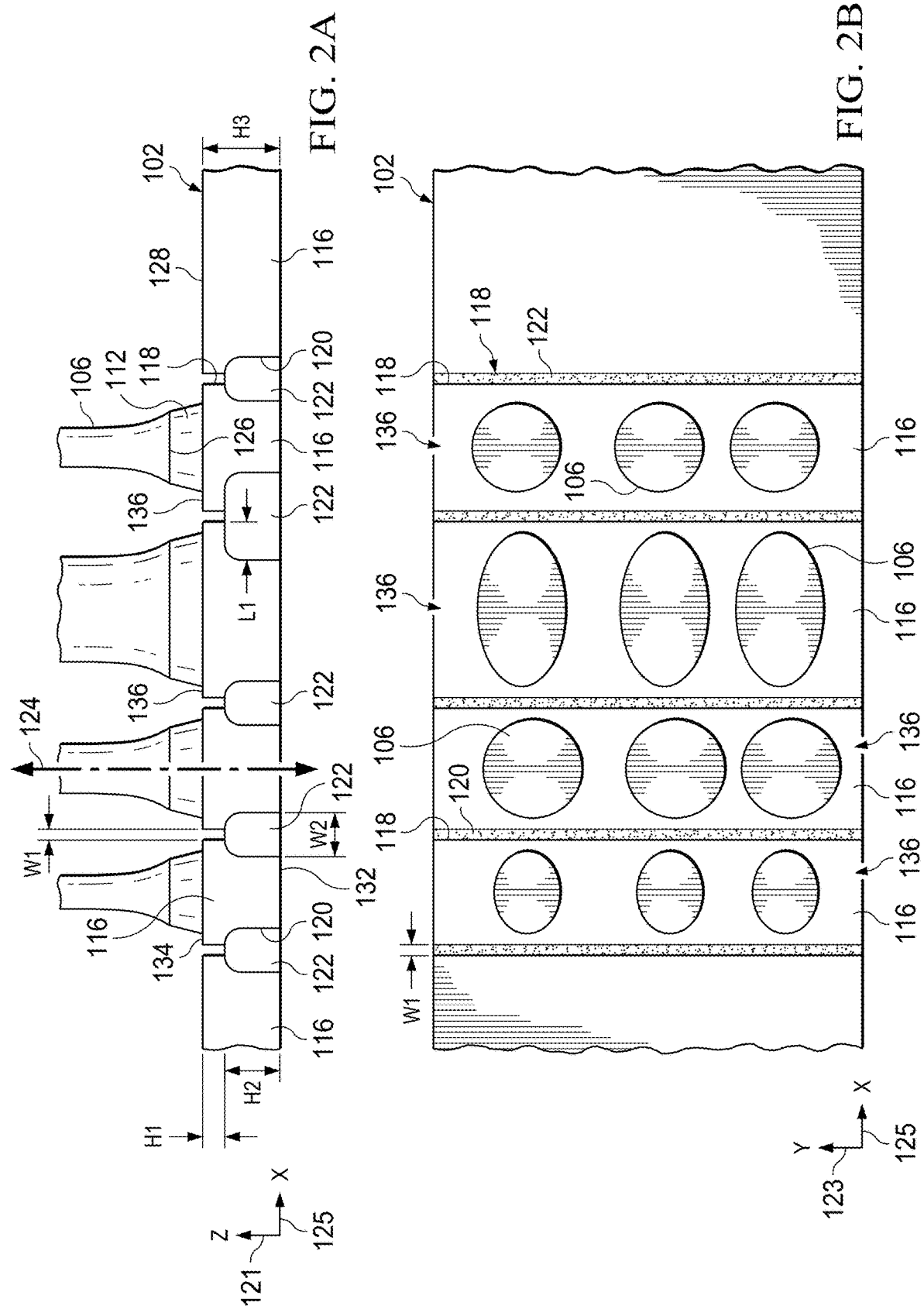

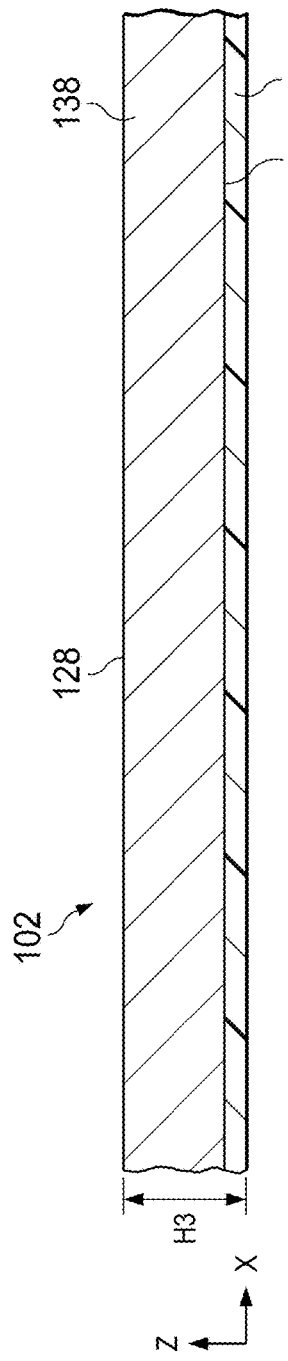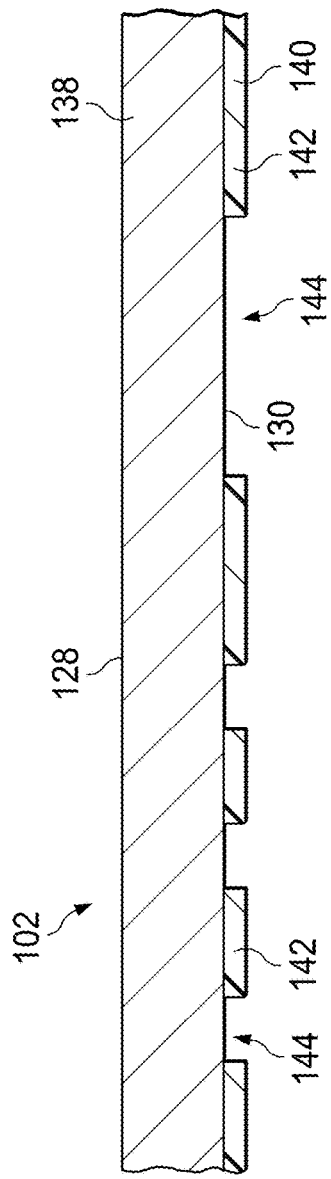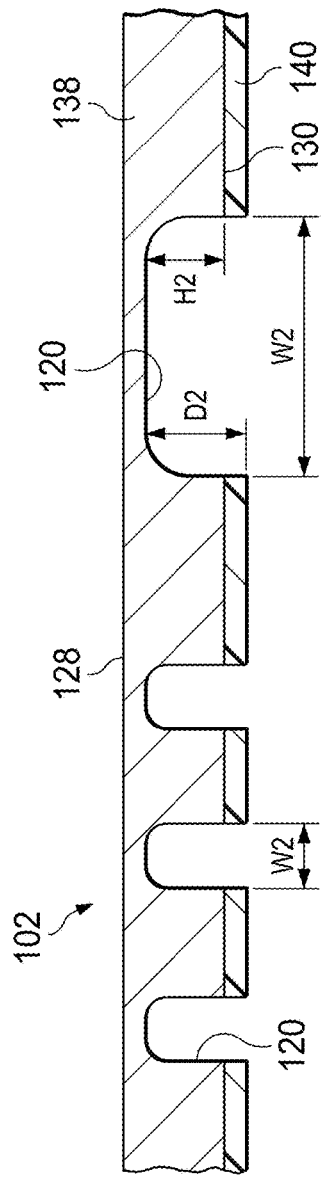

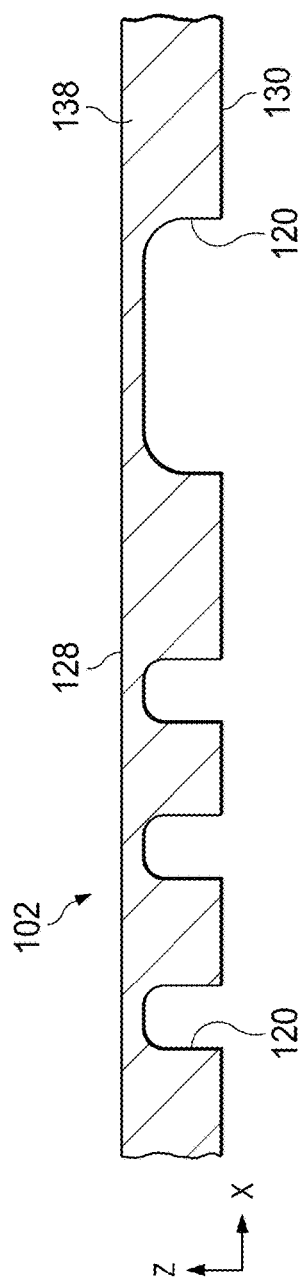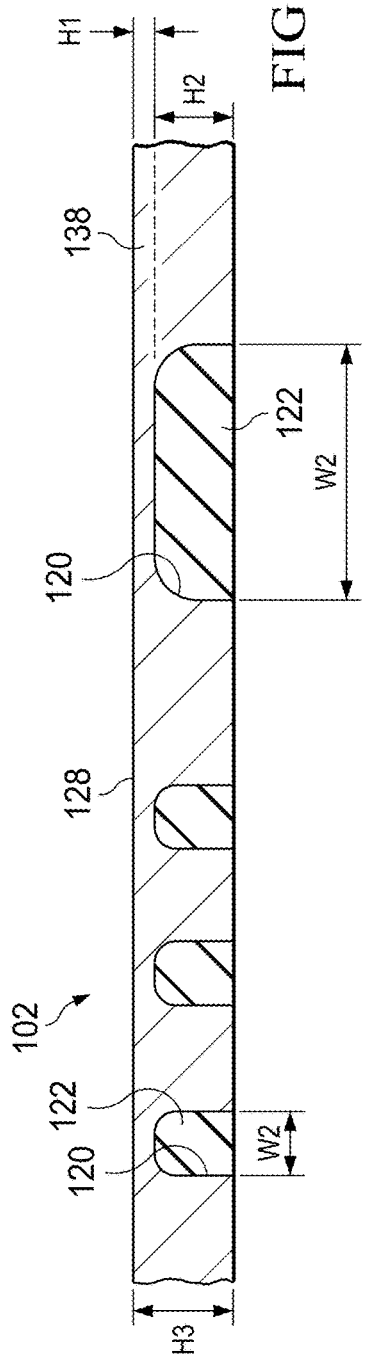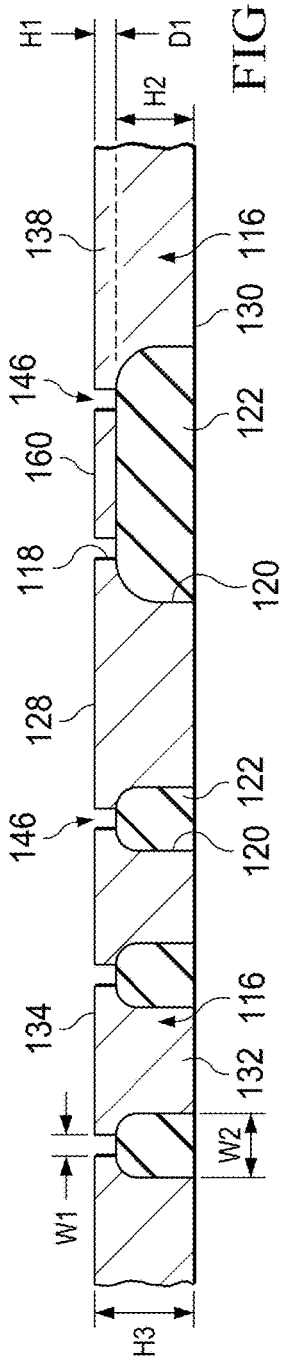

PRE-MOLDED LEADFRAMES IN SEMICONDUCTOR DEVICES

CROSS-REFERENCE TO RELATED APPLICATION

This application claims priority to and the benefit of U.S. Provisional Application Ser. No. 62/568,330, titled, "High Power Density Leadframes," filed Oct. 5, 2017, U.S. Provisional Application Ser. No. 62/568,331, titled, "High Power Density Packages," filed Oct. 5, 2017, and U.S. Provisional Application Ser. No. 62/568,333, titled, "Pre-Molded High Power Density Leadframes," filed Oct. 5, 2017, all of which are incorporated herein for all purposes.

BACKGROUND

This relates generally to semiconductor devices, and more particularly to pre-molded leadframes in semiconductor packages.

In some types of semiconductor packages, a semiconductor die is directly mounted to a leadframe via a plurality of interconnect bumps or posts. The plurality of interconnect bumps electrically connects the semiconductor die to the leadframe. Each interconnect bump's contact surface area at the semiconductor die is often the same size as the interconnect bump's contact surface area at the leadframe.

SUMMARY

In one illustrative example, a method for forming a semiconductor package includes forming a leadframe for the semiconductor package that involves providing a metal strip having a first side and a second side, wherein the second side opposes the first side, and cutting the first side of the metal strip to a depth D1 according to a cutting pattern to form a plurality of first channels. The depth D1 is less than the height H of the metal strip. Forming the leadframe further includes etching the second side of the metal strip to a depth D2 according to a photoresist pattern to form a second plurality of channels. The depth D2 is shallower than a height H1 of the metal strip. The height H being between the first side and the second side of the metal strip. Forming the leadframe also includes inserting an insulating material into the second plurality of channels. The first plurality of channels extends up to or at least partially into the insulating material in the second plurality of channels to form a plurality of leads on the leadframe. At least some of the first plurality of channels are in fluid communication with at least some of the second plurality of channels.

The method for forming a semiconductor package further includes coupling a plurality of bumps between a semiconductor die and a plurality of bump landing sites on the plurality of leads of the leadframe, wherein at least some of the plurality of bumps appear to overlap when viewed from an end along at last one of the plurality of leads; and covering at least a portion of the semiconductor die and at least a portion of the leadframe with a molding compound to form the semiconductor package.

In one illustrative example, a method for forming a semiconductor package includes forming a leadframe for the semiconductor package that involves providing a metal strip having a first side and a second side (wherein the second side is opposed to the first side and wherein the metal strip has a height H between the first side and the second side) and cutting the first side of the metal strip to a depth D1 according to a cutting pattern to form a first plurality of openings. D1 is less than the height H. Forming the leadframe further includes applying a photoresist on the second side of the metal strip, applying a chemical etch to the second side of the metal strip according to a photoresist pattern to form a second plurality of openings. A depth D2 of the second plurality of openings is less than the height H of the metal strip. Forming a leadframe further includes removing the photoresist from the second side of the metal strip and applying an insulating material or pre-mold compound into the second plurality of openings. The first plurality of openings extends into the second plurality of openings to form a plurality of leads on the lead frame.

The method for forming a semiconductor package further includes coupling a plurality of bumps between a semiconductor die and a plurality of bump landing sites on the plurality of leads of the leadframe. At least some of the plurality of bumps appear to overlap when viewed from an end along at last one of the plurality of leads, and wherein the plurality of leads are at least partially supported by the insulating material. The method also includes covering at least a portion of the semiconductor die and at least a portion of the leadframe with a molding compound to form the semiconductor package.

In one illustrative example, a semiconductor package includes a metal leadframe having a first side and a second side. The second side is opposed to the first side. The metal leadframe includes a first plurality of openings extending partially into the leadframe from the first side, the first plurality of openings having a lateral width W1; a second plurality of openings extending partially into the leadframe from the second side, the second plurality of openings having a lateral width W2 that is greater than the width W1, wherein the first plurality of openings intersect the second plurality of openings to form a plurality of leads; and an insulating material or pre-mold compound positioned in the second plurality of openings, wherein the insulating material at least partially supports the plurality of leads. Landing sites are on the first side of the leadframe between the first plurality of openings. The seminconductor package further includes a plurality of bumps extending from the landing sites to a semiconductor die and a molding compounding at least partially covering the plurality of bumps and the metal leadframe. Other examples are provided below.

BRIEF DESCRIPTION OF THE DRAWINGS

FIG. 2A is a schematic, front view in elevation of a portion of the semiconductor package of FIG. 1;

FIG. 2B is a schematic, top view of the semiconductor package of FIG. 2A;

FIGS. 3A-3F are schematic, cross-sectional, elevation views of an illustrative leadframe showing process steps for forming an illustrative leadframe;

DETAILED DESCRIPTION

Figure 1:
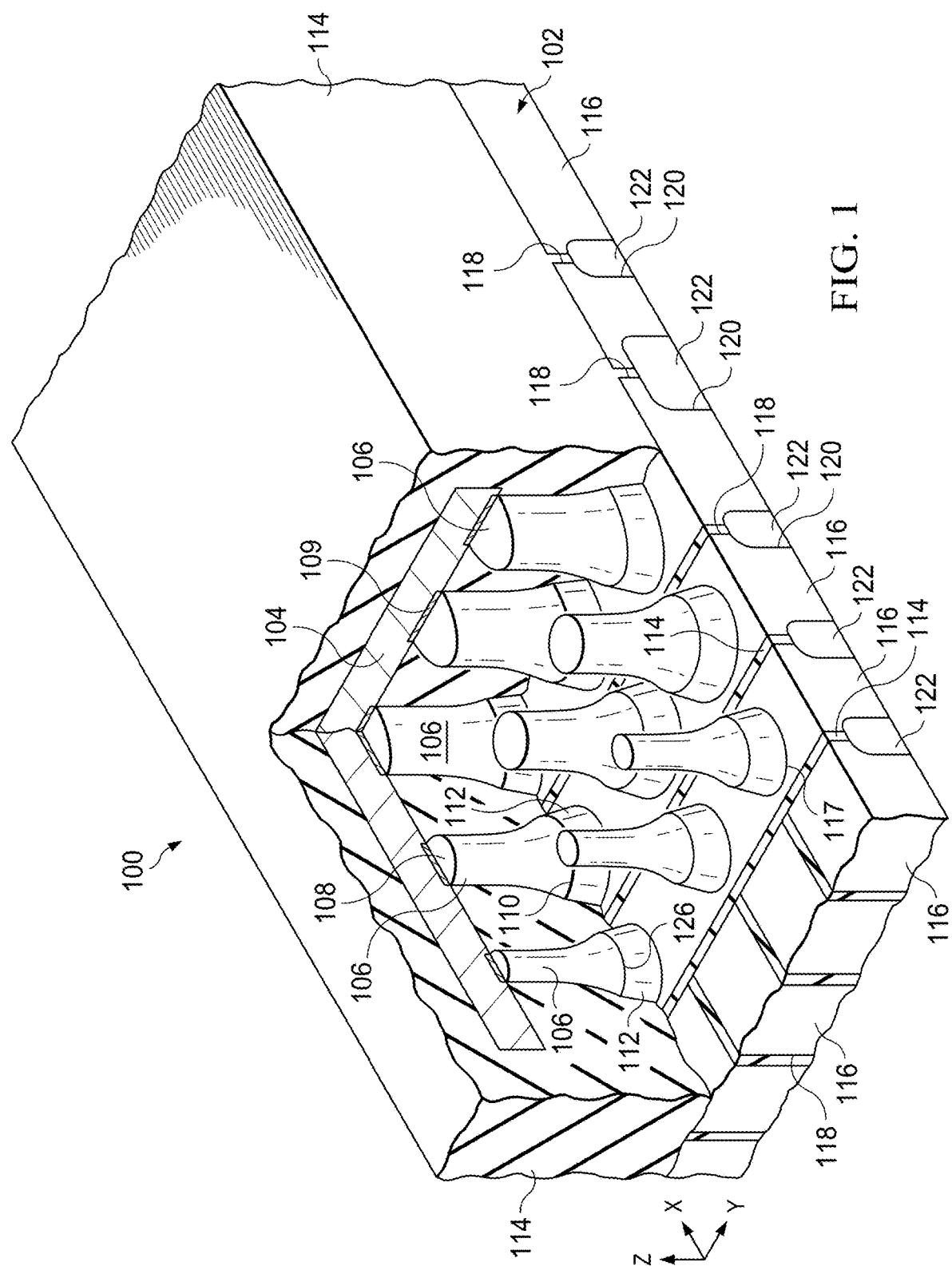
FIG. 1 is a schematic, partial-cut, perspective view of an illustrative semiconductor package.

Some semiconductor packages are configured such that a semiconductor die is directly mounted to a leadframe via a plurality of interconnect bumps, pillars, or posts. This type of packaging may provide improved electrical and thermal performance over other types of leaded packages that use wire bonding. Moreover, by eliminating the wire bonds that connect the semiconductor die to the leadframe, the package parasitic can be reduced.

However, semiconductor dies generally have a smaller available surface area for connecting to the interconnect bumps as compared to leadframes. And with the increased proliferation and functionality of electronics, it is desirable to further reduce the size of the semiconductor die. Consequently, as semiconductor dies shrink, the amount of surface area available for interconnect bump connections also shrinks. The surface area available on the semiconductor die for interconnect bump connections is one of the factors that helps determine the diameter size of the interconnect bump and the number of interconnect bumps that can be used to connect the semiconductor die to the leadframe.

The interconnect bumps have had a uniform, cylindrical shape; e.g., the diameter of the interconnect bump is uniform between the interconnect bump's die side and leadframe side. Thus, the interconnect bump's contact surface area at its die-connection side is the same as its contact surface area at its leadframe-connection side. Reducing the diameter of the interconnect bumps, reduces the interconnect bump's contact surface area not only on the semiconductor die but also the leadframe.

A reduction in the interconnect bump's contact surface area on the leadframe tends to causes the power and current density to increase at the junction between the interconnect bump and the leadframe. Increasing the power and current densities may result in higher temperatures and premature failures due to electromigration at the junction between the interconnect bump and the leadframe. Solder materials used to attach the interconnect bumps to the leadframe may contribute to electromigration issues due to the properties of the solder material used in attaching the interconnect bumps to the leadframe.

Reduction of the interconnect bumps contact surface area on the leadframe, however, is not the only possible issue. With increases in power and current transfers between the semiconductor die and the leadframe, a more substantial leadframe—thicker—may be needed to handle the increase in power and current transfer. In other words, the leadframe may need to be thicker between the die-connecting side and the printed circuit board (PCB)-connecting side. Due to manufacturing limitations, a thicker leadframe tends to lead to larger spaces (lateral width) between adjacent leadframe leads. Larger spaces or openings between the leadframe leads reduces the available surface area on the leadframe for interconnect bump contact, which also contributes to an increase in power and current densities at the junction between the interconnect bump and the leadframe. Reducing the spacing between the leadframe leads or developing patterned leads may increase the available surface area on the leadframe for bump connection. In one example, a pre-mold compound positioned in at least a portion of the spacing between the leadframe leads provides structural support to the leadframe, allowing for further customization of the leadframe design, including islands, as discussed in more detail herein, and closer leads.

Referring now to the figures and initially to FIG. 1, a schematic, partial-cut, perspective view of a semiconductor package 100, according to some aspects, is presented. The semiconductor package 100 includes a leadframe 102, a semiconductor die 104 and a plurality of bumps 106 that electrically connect sites on the semiconductor die 104 to the leadframe 102. The plurality of bumps 106 includes a first end 108 connected to sites on the semiconductor die 104 and an opposing, second end 110 connected to landing sites 136 on the leadframe 102. In one example, the first end 108 is coupled to a plurality of copper over anything (COA) elements 109. The leadframe 102 includes a plurality of leadframe leads 116 for receiving the second end 110 of the plurality of bumps 106 on areas that may be referred to as landing sites 136 of which 117 is one particular example.

The plurality of leadframes leads 116 or lead strips are physically separated from each other and are separated using a first plurality of openings 118 and a second plurality of openings 120. The first plurality of openings 118 is sized to enlarge the available area on the leadframe leads 116 for receiving the plurality of bumps 106. A pre-mold compound 122 is positioned in the second plurality of openings 120 to provide structural support to the plurality of leads 116 of the leadframe 102. The pre-mold compound 122 substantially fills or partially fills the second plurality of openings 120. The available area on the leadframe leads 116 may be referred to as landing areas or strips or landing sites 136; each landing site is an area on the leadframe lead for receiving the base or end of a bump. Aspects of the leadframe 104 will be discussed in more detail below.

The semiconductor package 100 includes a solder material 112 positioned between the plurality of bumps 106 and the leadframe 102. The solder material 112 is used to attach the second end 110 of the plurality of bumps 106 to the landing site 136 on the leadframe 102. In some examples, the solder material 112 is formed of a tin-silver (SnAg) alloy. In other examples, other types of solders are used, such as SnPb, Sn, SnAgCu, or other alloys of Sn or Bi, to name some.

A solder-bump interface 126 is formed between the second end 110 of the plurality of bumps 106, which may be power or signal bumps or other connective bumps, and the solder material 116. The solder-bump interface 126 may be subject to electromigration problems, including void propagation. Increased current densities can contribute to breakdown of the solder-bump interface 126, which can create reliability issues and prevent the placing of some types of active circuits in the semiconductor die 104 adjacent to the plurality of bumps 106. In some aspects, by increasing the available surface area on the leadframe 102 for receiving the plurality of bumps 106 on landing sites 136, the current densities flowing through the solder-bump interface 126 are decreased, thereby increasing the life of the solder-bump interface 126 and the semiconductor die 104.

Still referring primarily to FIG. 1, in some aspects, the semiconductor package 100 further includes a molding compound 114 to protect the components in the semiconductor package 100. The molding compound 114 provide structural support to the semiconductor package 100 and covers at least a portion of the leadframe 102, the semiconductor die 104, the plurality of bumps 106 or any combination thereof. In some aspects, the molding compound 114 further fills in the gaps between components of the semiconductor package 100, such as, for example, between the plurality of bumps 106 or in the first plurality of openings 118 of the leadframe 102. In yet some examples, the molding compound 114 is an epoxy, polymer or other insulating material. The molding compound 114 is generally added after the semiconductor die 104 and leadframe 102 have been assembled together.

The pre-mold compound 122, as previously mentioned, is positioned in or otherwise fills the second plurality of openings 120. In some examples, the pre-mold compound 122 is an epoxy, polymer, ceramic or other insulating material. In contrast to the molding compound 114, the pre-mold compound 122 is added during formation of the leadframe 102 and prior to the semiconductor die 104 and the leadframe 102 having been assembled together (FIGS. 3A-3F below, discuss formation of the leadframe 102 in more detail). Molding compound 114, however, is added after the semiconductor die 104 and the leadframe 102 have been assembled together. Also, the pre-mold compound 122 is directed primarily to providing structural support to the leadframe 102, whereas the molding compound 114 is directed to providing structural support to the semiconductor package 100 in general.

The pre-mold compound 122 improves the rigidity of the leadframe 102, by providing structural support, and improves the flatness of the leadframe 102. The pre-mold compound 122 assists with local rigidity. When certain portions of the leadframe features (or lead fingers or leads) become too long and cantilever, then they tend to locally bend. In some examples, having a pre-mold compound 122 holds the whole structure and its components together. The pre-mold compound 122 also addresses rigidity against the whole leadframe bending. As the leadframe gets bigger and thinner metal (to get better design rules), the one or both ends of the leadframe may bend and, in some aspects, the pre-mold compound 122 helps address the issue. The pre-mold compound 122 also helps address warpage. Warpage can happen along the vertical axis, horizontal lateral x-axis, horizontal y-axis, or a combination of these to create bowl shape of warpage; thus, in some examples, the pre-mold compound 122 addresses the warpage as well. In some examples, by having improved flatness/rigidity, the leadframes can be handled/passed through the grooves and slots of manufacturing machines, can be reliably inserted and taken from the carriers without damaging, and when the die is connected, ensures all the pins are in contacts and attached completely.

Referring now primarily to FIGS. 2A-2B, with continued reference to FIG. 1, a portion of the semiconductor package 100 is presented. FIG. 2A represents a schematic front view in elevation, and FIG. 2B represents a schematic, top view of the plurality of bumps 106 on the leadframe 102. The leadframe 102 includes a first side 128 and an opposing, second side 130, with the plurality of bumps 106 connected to the first side 128. The leadframe 102 has a depth or height, H3, extending between the first side 128 and the second side 130. In some examples, H3 depends on the intended package outline. In one example, discrete semiconductor packages that have a single silicon die performing one function tend to have a lead frame thicknesses on the order of 0.38-0.64 mm and packages with multi-function integrated circuits are in the range of 0.127 mm-0.26 mm, but those skilled in the art will appreciate the various thicknesses may be used with different applications and these are only some examples.

In FIG. 2A, the plurality of bumps 106 are illustrated as having a tapered shape, which will be described in more detail below. However, for simplicity, in FIG. 2B, the plurality of bumps 106 are schematically shown without illustrating the tapered details shown in FIG. 2A. It should be noted that straight bumps coupled also be used.

The leadframe 102 includes the first plurality of openings 118 that extends partially into the leadframe 102 from the first side 128 to a depth or height, H1, and includes the second plurality of openings 120 that extend partially into the leadframe 102 from the second side 130 to a depth or height, H2. The pre-mold compound 122 fills or substantially fills the second plurality of openings 120 to at least provide at least some structural support to the leadframe 102 or isolation of an island as explained elsewhere herein. Both the first plurality of openings 118 and the second plurality of openings 120 extend into the leadframe 102 in a vertical (for orientation shown) direction, e.g., parallel to the z-axis 121. In some examples, the first plurality of openings 118 and the second plurality of openings 120 are aligned along a vertical axis, e.g., the z-axis 121. The second plurality of openings 120 is wider than the first plurality of openings 118.

In yet some examples, the first plurality of openings 118 and the second plurality of openings 120 are aligned to intersect and fully separate portions of the leadframe 102 into, for example, the plurality of leadframe leads 116. In some examples, separation of the leadframe 102 occurs along the z-axis 121, the y-axis 123, the x-axis 125 or a combination thereof; there is space formed between portions of the leadframe 102.

There may be instances, however, where full separation of the leadframe 102 is not desired, such that some of the first plurality of openings 118 or some of the second plurality of openings 120 are not fully aligned. Likewise, there may be some instances where one of the second plurality of openings 120 is needed in a position that is not fully aligned with one of the first plurality of openings 118 or vice versa. In some examples, the first plurality of openings 118 and the second plurality of openings 120 are linearly arranged. In other examples, the first plurality of openings 118 are nonlinear or otherwise have a curvature or non-linear pattern, see, e.g., FIG. 4. The first plurality of openings 118 is formed according to a cutting pattern 146 (see, e.g., FIG. 3F). The openings 118, 120 allow for different patterns as explained further below.

The first plurality of openings 118 has a lateral width W1 (width of the cut) and, in some examples, is formed using a laser, jet, or other techniques as described further below. In some examples, the width W1 of the first plurality of openings 118 is less than approximately 75 micrometers. In yet some examples, the width W1 of the first plurality of openings 118 is approximately 50 micrometers and still another example 25 micrometers or less. In contrast, it should be appreciated that other techniques, e.g., using etching only, can create a width of no less than 125 micrometers. As previously mentioned, the first plurality of openings 118 extend partially into the leadframe 102 from the first side 128. Thus, the width W1 of the first plurality of openings 118 impacts the surface area on the first side 128 of the leadframe 102 available for connection with the plurality of bumps 106. By making small widths, W1, a technical advantage of having more surface area for bumps is realized. Moreover, with the support of the insulating materials, or pre-mold compound, the widths, W1, can be smaller than otherwise possible. In some examples, the width W1 of each of the first plurality of openings 118 differs in size. In one example, one of the first plurality of openings 118 has a width of approximately 25 micrometers and another of the first plurality of openings 118 has a width of approximately 35 micrometers.

The second plurality of openings 120 has a lateral width W2 that is greater than W1. In some examples, the width W2 of the second plurality of openings 120 is greater than approximately 125 micrometers. In yet some examples, the width W2 of the second plurality of openings 120 is 200 micrometers or greater. In some aspects, the pre-mold compound 122 allows the width W2 of the second plurality of openings 120 to be greater than would otherwise be possible without the additional structural support provided by the pre-mold compound 122. In some examples, the width W2 of the second plurality of openings 120 is in the range of approximately 50 micrometers to 5 mm. The width W2 of each of the second plurality of openings 120 may also differ in size. In some aspects, the width W2 of each of the second plurality of openings 120 depends on printed circuit board (PCB) specifications. In an illustrative example, one of the second plurality of openings 120 has a width of approximately 125 micrometers and another of the second plurality of openings 120 has a width of approximately 200 micrometers. In this example, the width W2 of the second plurality of openings 120 is greater than the width W1 of the first plurality of openings 118. In some aspects, making W2 large while keeping W1 small is one of the issues that the pre-molding addresses. That combination is difficult to achieve otherwise; by having large W2, pins on the PCB can be separated out far to accommodate lower cost manufacturing, high voltages, or routing flexibility.

The first plurality of openings 118 has a height H1 (or depth D1), and the second plurality of openings 120 has a height H2 (depth D2). Typically, the height H1 of the first plurality of openings 118 and the height H2 of the second plurality of openings 120 will together equal the height H3 (depth D3, which is total thickness) of the leadframe 102. In some examples, the height H2 of the second plurality of openings 120 is approximately 50 to 90 percent of the height H3 of the leadframe 102. In one example, the height H3 of the leadframe 102 is approximately 200 micrometers, the height H1 of the first plurality of openings 118 is approximately 50 micrometers and the height H2 of the second plurality of openings 120 is approximately 150 micrometers. In some examples, the height H1 of the first plurality of openings 118 is approximately 75 micrometers or less. The pre-mold compound 122 provides support over the second plurality of openings 120, and this allows the height H2 of the second plurality of openings 120 to be larger than would otherwise be possible so that the height H1 of the first plurality of openings 118 may be smaller. In some aspects, having a smaller H1, allows for finer or smaller W1. And, when one has a finer W1, one can have a higher density of bumps and interconnects because more landing sites can be included; the pre-molding compound 122 provides the needed support for the thin overhanging cantilevered portion 134 and allows one to do a fine W1 cut using laser, jet, chemical or otherwise as referenced elsewhere herein.

Referring still primarily to FIGS. 1-2B, and with particular reference to FIG. 2A, the leadframe 102 includes the plurality of leadframe leads 116, with the leadframe leads 116 having a full body portion 132 and a cantilevered portion 134 that extends laterally from the full body portion 132 a length L1. With respect to the z direction 121, the full body portion 132 extends between the first side 128 and the second side 130 of the leadframe 102. The cantilevered portion 134 extends laterally from the full body portion 132 on the first side 128 of the leadframe 102, which creates a larger surface area on the first side 128 of the leadframe 102 for landing sites for receiving the plurality of bumps 106. In some examples, the length L1 that the cantilevered portion 134 extends from the full body portion 132 is between approximately 0 and 5 mm or greater. The pre-molding compound 122 allows for a large variation in the cantilevering, length L1.

The pre-mold compound 122 supports, at least in part, the cantilevered portion 134, which allows the length L1 that the cantilevered portion 134 extends from the full body portion 132 to be greater than would otherwise occur absent the pre-mold compound 122. The pre-mold compound's 122 support of the cantilevered portion 134 is one of the reasons the width W2 of the second plurality of openings 120 may be increased. The cantilevered portion 134 is approximately the same height or depth as the height H1 of the first plurality of openings 118. It should be appreciated, however, that due to manufacturing techniques, sections of the cantilevered portion 134 closest to the full body portion 132 have a slightly greater height or thickness than the height H1 of the first plurality of openings 118 in some examples. The thickness of the cantilevered portion 134 should be great enough to support the plurality of bumps 106 and prevent fusing of adjacent cantilevered portions during power transfer between the plurality of bumps 106 and the plurality of landing leads 116.

The plurality of leadframe leads 116 includes landing areas or strips or landing sites 136 on the first side 128 of the leadframe 102 between members of the first plurality of openings 118. In some examples, the landing sites 136 extend over the cantilevered portions 134 of the leadframe leads 116, thereby increasing the surface area for landing sites or areas. The landing areas or landing sites 136 are the areas available for receiving and supporting the plurality of bumps 106. The landing area on strip 136 provides a location for the second end 110 of the respective bump 106 (with concomitant solder 112) to attach; that is, the landing area or landing site provides a place for the base of a corresponding bump on the lead.

Still referring primarily to FIGS. 1-2B, the plurality of interconnect bumps 106 extend between the semiconductor die 104 and the leadframe 102 parallel to a longitudinal axis 124 in the z-direction 121. The plurality of interconnect bumps 106 may also be referred to as pillars or posts. In some examples, each of the plurality of interconnect bumps 106 has a nonlinear shape along the longitudinal axis 124. In one example, the first end 108 of the plurality of interconnect bumps 106 has a width or diameter that is less than a width or a diameter of the second end 110. Likewise, the first end 108 of the plurality of interconnect bumps 106, in one example, has a lateral surface area (perpendicular to longitudinal axis) that is less than a lateral surface area of the second end 110 of the plurality of interconnect bumps 106.

In some examples, each of the plurality of interconnect bumps 106 is tapered from the second end 110 to the first end 108, such that each of the plurality of interconnect bumps 106 decreases in lateral width from the second end 110 (lead side) towards the first end 108 (die side). In some examples, the end surface area (lateral end) of the second end 110 of each of the plurality of interconnect bumps 106 is greater than the size of the end surface area (lateral end) of the first end 108 by a factor of 1 to 3 or more. In yet some examples, the surface area of the second end 110 is approximately 2 times the size of the surface area of the first end 108. The ratio between the surface area of the second end 110 and the surface area of the first end 108 may be modified based on the available surface area and components on the semiconductor die 104 and the available surface area, e.g., the bump landing site area 136, on the leadframe 102 for interconnect bump connections. Moreover, due to the structural support provided to the cantilevered portions 134 on the leadframe 102 by the pre-mold compound 122, over which the landing site area 136 may extend, the ratio between the surface area of the second end 110 and the surface area of the first end 108 may be further modified because the landing site area 136 may be able to structurally support a larger surface area of the second end 110 of the plurality of interconnect bumps 106.

In some examples, each of the plurality of interconnects bumps 106 has a truncated-cone or frustum shape along or parallel to the longitudinal axis 124 with a circular cross-sectional shape or other curvilinear shape or some other shape transverse (lateral) to the longitudinal axis 124. In yet some examples, the plurality of interconnect bumps 106 has a nonlinear shape along the longitudinal axis 124 with an oval cross-sectional shape transverse to the longitudinal axis 124—although other geometric shapes might be used such as squares, triangles, polygons, oval (see FIG. 4C), or others. The plurality of interconnect bumps 106 may take a number of nonlinear shapes along the longitudinal axis 124 but typically is such that a surface area of the second end 110 is different than the surface area of the first end 108.

In some examples, shaping the plurality of bumps 106 to allow the second end 110 of the plurality of bumps 106 to be larger (vis-à-vis lateral end surface area) than the first end 108 of the plurality of bumps 106 allows the first end 108 to be small enough to fit on landing sites on the semiconductor die 104, while allowing the second end 110 to take advantage of the larger surface area available on the plurality of leadframe leads 116. In one example, the landing areas 136 are further increased by reducing the spacing (e.g., the width W1 of the first plurality of openings 118) between the leadframe leads 116 to allow for an even larger second end 110 of the plurality of bumps 106 to connect to the leadframe leads 116. This is a technical advantage. Moreover, increasing the available surface area on the plurality of lead leads 116 may not only allow for the second end 110 of the plurality of bumps 106 to be larger, but the number of the plurality of bumps 106 that may connect to the leadframe 102 may be increased. All of these aspects, individually or together, help reduce current and power densities flowing between the second end 110 of the plurality of bumps 106 and the leadframe 102 and decrease thermal inefficiencies. Likewise, increasing the size of the second end 110 of the plurality of bumps 106 increases the efficiency of the current exchange, which may result in a decrease in heat output at the solder-bump interface 126.

Referring now primarily to FIGS. 3A-3F, schematic, cross-sectional diagrams showing process steps for forming a leadframe, e.g., the leadframe 102 of FIG. 1, according to some examples, are presented. Referring to FIG. 3A, the leadframe 102, which has the first side 128, the opposing second side 130 and the depth or height H3 therebetween, is formed of a metal sheet or film 138. The leadframe 102, in some aspects, maintains its height H3 during these formations steps; thus, the first side 128, the second side 130 and the height H3 therebetween also applies to the metal sheet, metal film, or metal strip 138 and will be used to denote the corresponding sides and height of the metal strip 138. In some examples, the metal strip 138 is formed of copper or a copper alloy. Other suitable metals or materials may be employed. A photoresist 140 is deposited on the second side 130 of the metal strip 138.

With reference to FIGS. 3B-3C, a mask (not explicitly shown) is placed on the photoresist 140 according to a photoresist pattern 142. The photoresist 140 is exposed to light to form a plurality of openings 144 in the photoresist 140 in accordance with the photoresist pattern 142. A chemical etch is applied to the second side 130 of the metal strip 138 to a depth D2 (FIG. 3C), according to the photoresist pattern 142. The chemical etch forms the second plurality of channels 120, or openings, which has the depth or height D2/H2 from the second side 130.

The depth D2 is shallower than the overall height H3 of the leadframe 102. In some examples, the etch is applied to the second side 130 of the metal strip 138 until 50 to 90 percent of the height H3 of the leadframe 102 (or the metal strip 138) is removed. In some examples, the etch is applied to the second side 130 of the metal strip 138 until 80 percent of the height H3 of the leadframe 102 (or the metal strip 138) is removed. The etching step should leave enough of the metal strip 138 such that the height H1 (FIG. 2A) of the first plurality of openings 118 is thick enough to support the plurality of bumps 106 (shown in FIG. 1) at least with pre-mold compound 122 (FIG. 3C) in place and prevent fusion between adjacent leadframe leads 116 (FIG. 2A) during, for example, power and current transfers between the plurality of bumps 106 and the leadframe 102.

Each of the second plurality of openings 120 has the lateral width W2 (FIG. 3C). In some examples, some of the second plurality of openings 120 have different widths than others of the plurality of openings 120. In one example, the width W2 of one of the second plurality of openings 120 is 200 micrometers or greater and the width W2 of another of the second plurality of openings 120 is approximately 150 micrometers. The width W2 of each of the second plurality of openings 120 may be based upon the printed circuit board (PCB) specifications. In some aspects, any of a number of factors may influence the width W2: PCB, operating voltage, level of precision required (noise from the pins next to it), PCB routing flexibility, or PCB manufacturing cost.

With reference primarily to FIG. 3D, the photoresist 140 is removed. In some examples, the photoresists 140 is removed later in the formation process. In some examples, the photoresist 140 (FIG. 3C) is removed before or after the pre-mold compound 122 is inserted into the plurality of second channels 120.

With reference primarily to FIG. 3E, the pre-mold compound 122 is positioned in the second plurality of openings 120 to partially or substantially fill the same. In some examples, the pre-mold compound 122 is an insulating material.

With primarily reference to FIG. 3F, the first side 128 of the metal strip 138 is cut to a depth D1, according to the cutting pattern 146. In some aspects, the depth D1 of the cut extends past the portion of the metal strip 138 and into the pre-mold compound 122 to ensure full separation of the metal strip 138. The cut forms the first plurality of openings 118, which has the depth D1 or height H1. The depth D1/H1 is shallower than the overall height H3 of the leadframe 102. The depth D1 is sufficient to connect the first plurality of openings 118 with the second plurality of openings 120; this provides a common space and provides isolation to form the plurality of leads 116.

That is, the first plurality of openings 118 joins with the second plurality of openings 120 in the vertical (for orientation shown) direction to separate the leadframe 102 into the plurality of leadframe leads 116. At least some of the first plurality of openings 118 are over cut such that the cut extends slightly into the pre-mold compound 122, which is in the second plurality of openings 120, such that the depth of the cut is slightly longer than the height H1 of the first plurality of openings 118; e.g., the cut depth extends from the first side 128 of the metal strip 138 slightly into the pre-mold compound 122. In this aspect, the cut extends into the pre-mold compound 122 just enough to ensure the metal strip 138 is fully separated into the plurality of leadframe leads 116. In some examples, the overcut may be up to 15 micrometers or sometimes 20% of H2 in order to achieve complete separation. In some aspects, at least some of the first plurality of openings 118 is fluidly connected to at least some of the second plurality of openings 120.

In some examples, the metal strip 138 is cut such that the first plurality of openings 118 has the lateral width W1 that is less than 75 micrometers and in other examples less than 50 micrometers. In yet some examples, the metal strip 138 is cut such that the first plurality of openings 118 has the lateral width W1 that is approximately 25 micrometers or less. In some examples, a laser, a precision water jet, electrical discharge machining, or plasma cutter, mechanical cutter, or any of those mentioned elsewhere, is used to cut the metal strip 138 to form the first plurality of openings 118 therein. Other suitable devices may be used that are capable of creating openings at least less than 50 micrometers wide. Although these devices may be capable of creating wider openings, in some aspects, these cutting devices are capable of creating precise, nonlinear or curved openings according to the cutting pattern 146 and desired depth, e.g., the depth D1. In some examples, the cutting pattern 146 and the first plurality of openings 118 have a customized pattern or shape at least in one of the horizontal directions, e.g., the x-axis or y-axis (shown in FIGS. 1-2B) if not both. This provides an advantage in that the pattern may allow larger bumps on the leadframe 102.

The lateral width W1 between the first plurality of openings 118 and the height H1 of the first plurality of openings 118 is sufficient to prevent fusion between adjacent cantilevered portions 134 during operations. The depth D2 that the second cut, e.g., chemical etch, is applied to the second side 130 of the metal strip 138 is controlled accordingly.

In one example, the step of cutting the metal strip 138 to form the first plurality of openings 118 is performed after the step of etching the metal strip 138 to form the second plurality of openings 120. In some examples, the cutting pattern 146 and the photoresist pattern 142 are aligned or coordinated. In some examples, the photoresist pattern 142 is removed after the cutting step. In yet some examples, the cutting of the first side 128 of the metal strip 138 aligns with locations where at least 50 percent of the height H1 has been etched from the second side 130 of the metal strip 138. In some examples, the cut forming the first plurality of openings 118 is made after the cut forming the second plurality of openings 120 and after at least partially filling the second plurality of openings 120.

In some examples, the photoresist pattern 142 is substantially linear such that the second plurality of openings 120 is substantially linear. In some examples, the cutting pattern 146 is also substantially linear such that the first plurality of openings 118 is substantially linear (see, e.g., FIG. 2B). In other examples, the cutting pattern 146 is nonlinear, i.e., curvilinear, such that the first plurality of openings 118 is substantially (e.g., majority) nonlinear or curved. A nonlinear cutting pattern may include straight lead portions connected at angles (see, e.g., FIG. 5).

Figure 4A:
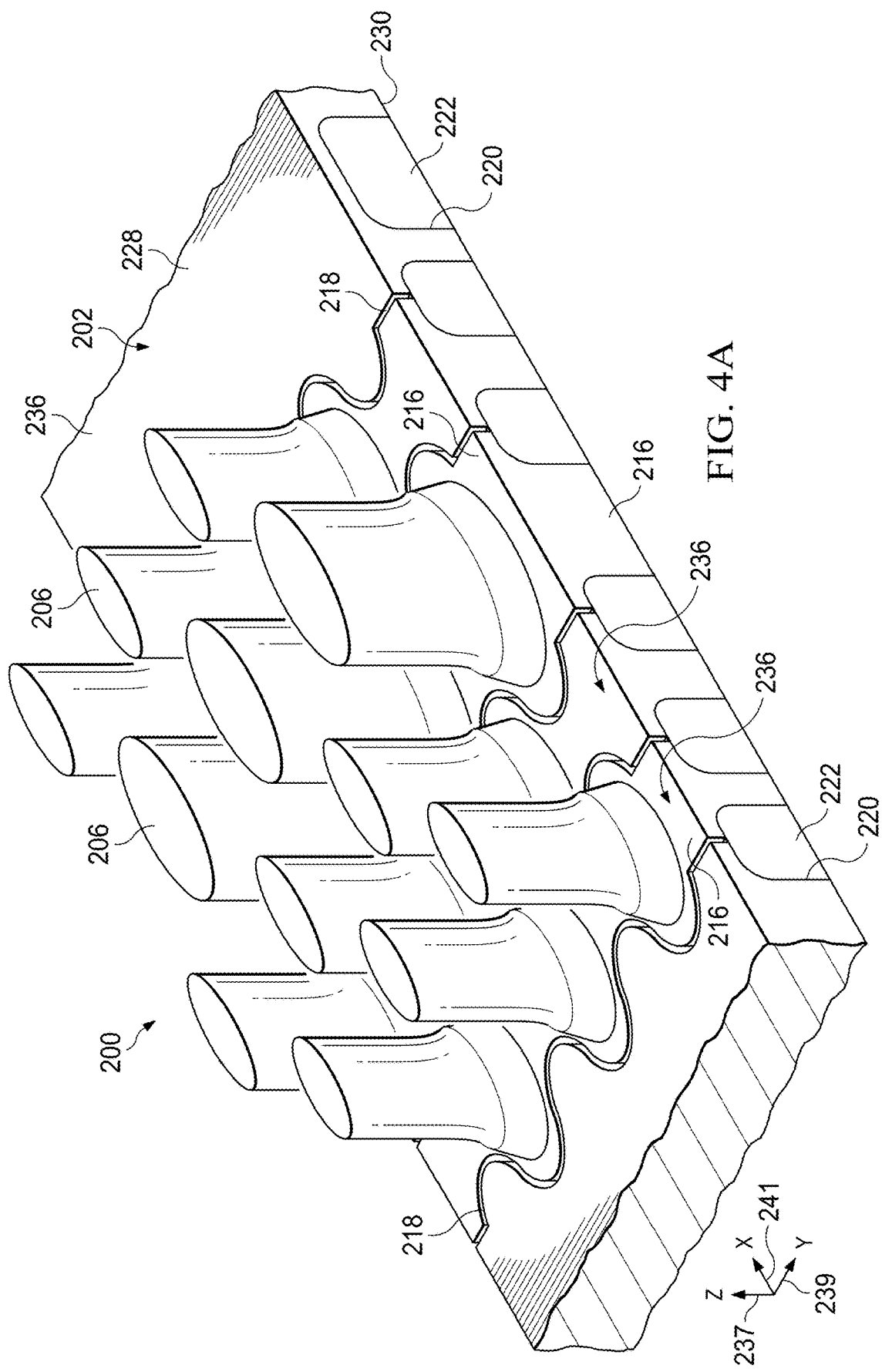
FIG. 4A is a schematic, perspective view of a portion of an illustrative semiconductor package.
Figure 4B:
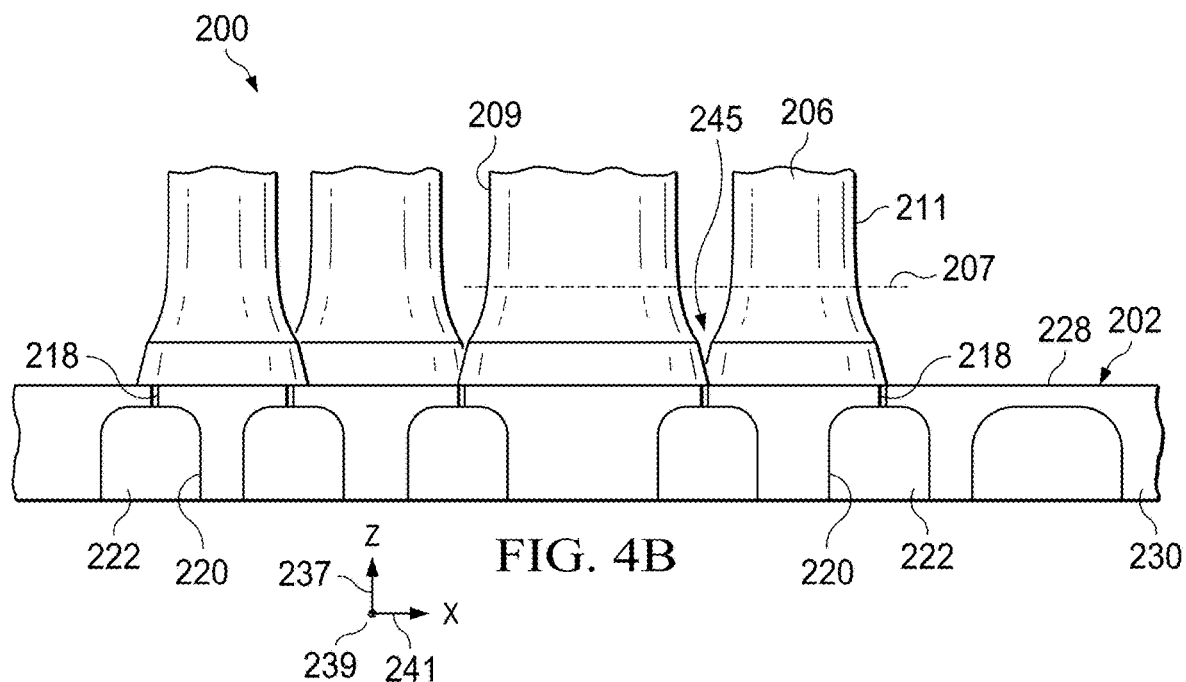
FIG. 4B is a schematic, front view in elevation of the semiconductor package of FIG. 4A.
Figure 4C:
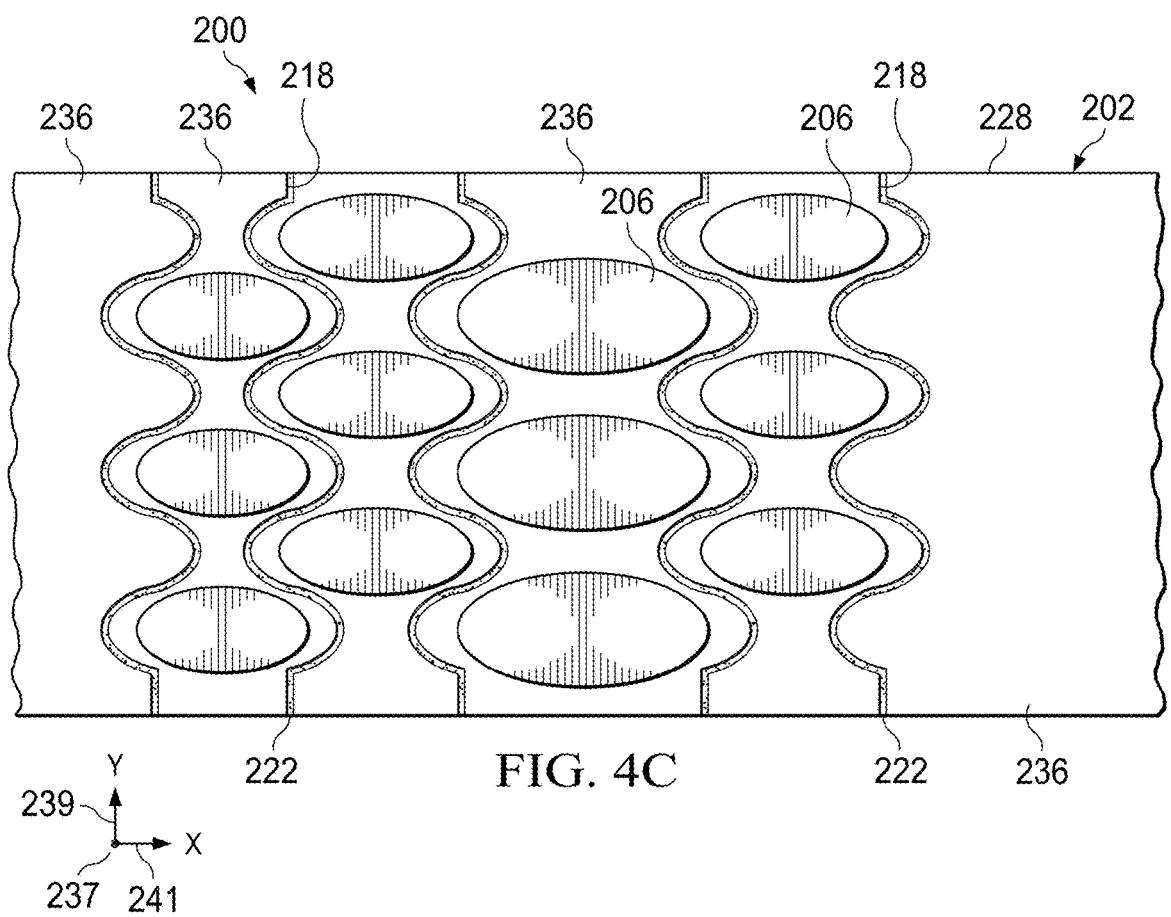
FIG. 4C is a schematic, top view of the semiconductor package of FIG. 4A.
Figure 4D:
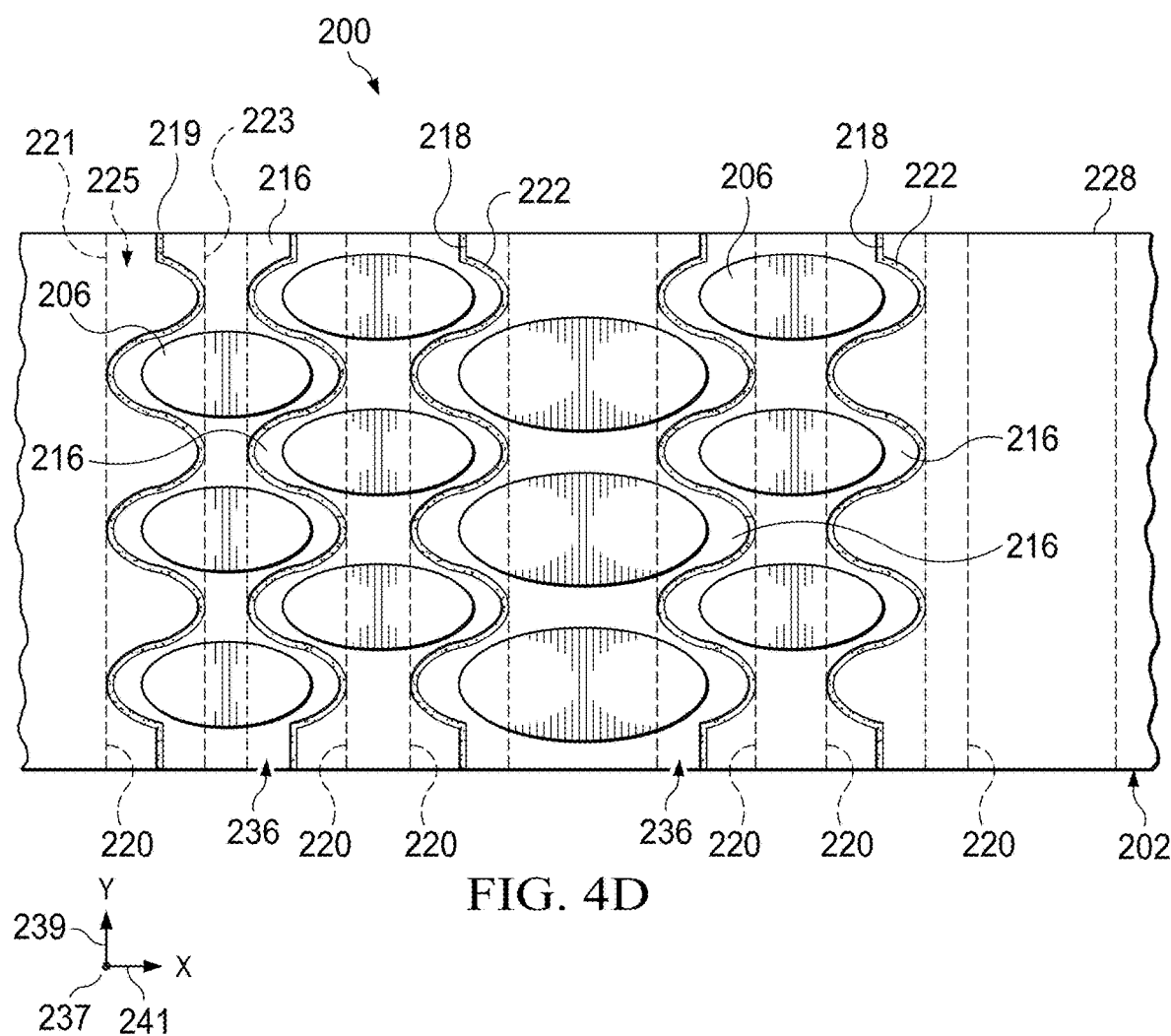
FIG. 4D is a schematic, top view of the semiconductor package of FIG. 4A with the second plurality of openings shown via hidden lines.

Referring now primarily to FIGS. 4A-4D, a portion of a semiconductor package 200 is presented that includes a leadframe 202 with a plurality of interconnect bumps 206 extending therefrom. FIG. 4A represents a schematic, perspective view of the semiconductor package 200. FIG. 4B represents a schematic, front view in elevation of the semiconductor package 200. FIG. 4C represents a schematic, top view of the semiconductor package 200 with a die not shown. FIG. 4D represents another schematic, top view of the semiconductor package 200 without the die and with aspects of the semiconductor package 200 shown via hidden lines.

The leadframe 202 has a first side 228 and an opposing, second side 230. The plurality of interconnect bumps 206 extends from the first side 228 of the leadframe 202 toward a die (see 104 in FIG. 1). A first plurality of openings 218 extends into the leadframe 202 from the first side 228, and a second plurality of openings 220 extends into the leadframe 202 from the second side 230. A pre-mold compound 222 is positioned in and fully or partially fills the second plurality of openings 220. The first plurality of openings 218 and the second plurality of openings 220 are connected such that the leadframe 202 is fully separated along a vertical (for orientation shown) axis, e.g., the z-axis 237. In yet some aspects, first plurality of openings 218 and the second plurality of openings 220 are connected such that the leadframe 202 is fully separated along a vertical axis and a horizontal axis, e.g., the z-axis 237 and the y-axis 239 to form a plurality of leads 216. In some examples, the first plurality of openings 218 and the second plurality of openings 220 are referred to as being in fluid communication and form a common, connected space.

The leadframe 202 differs from the leadframe 102 of FIGS. 1-2B in that the first plurality of openings 218 are nonlinear and have a curvature, sinusoidal, custom, or other nonlinear pattern. In contrast, each of the first plurality of openings 118 illustrated in FIGS. 1-2B is straight or linear along a horizontal (for orientation shown) axis, e.g., the y-axis. The first plurality of openings 218 are still aligned with (over the top of) the second plurality of openings 220 such that the leadframe 202 is fully segmented or separated at least along the z-axis 237 to creation isolation. The leadframe 202 is separated into a plurality of leadframe leads 216. The first plurality of openings 218 and the second plurality of openings 220 are formed using techniques described above with regard to FIGS. 3A-3E. Not only do the precision cutting apparatuses described above form smaller and more precise cuts compared to etching techniques, but the cutting apparatuses, in some examples, form the first plurality of openings 218 in custom, nonlinear geometric shapes. This allows for what appears to be overlapping landing sites (bumps 206 when installed) when viewed from an end (see, e.g., FIG. 4B); this may be referred to as being interdigitized, intermeshed, or apparent bump overlap when viewed from an end along one or more leads (end view). The pre-mold compound 222 further facilitates forming the first plurality of openings 218 in custom, nonlinear geometric shapes for at least the reason that the pre-mold compound 222 provides structural or mechanical support to the leadframe 202, i.e., provides pre-mold compound support.

As shown clearly in FIG. 4B, the plurality of interconnect bumps 206 differs from the plurality of interconnect bumps 106 of FIGS. 1-2B in that some of the plurality of interconnect bumps 206 overlap 245 (that is, appear to overlap from certain views including FIG. 4B) others of the plurality of interconnect bumps 206 along one or more horizontal directions, e.g., the x-axis 241, the y-axis 239 or a combination thereof. In some examples, the plurality of interconnect bumps 206 are sized or shaped to take advantage of the increased and sometimes unique surface areas or bump landing sites 236 on the first side 228 of the leadframe 202. In yet some examples, some of the plurality of interconnect bumps 206 are larger than others of the plurality of interconnect bumps 206. In some examples, the size of each of the plurality of interconnect bumps 206 are customized based on what devices in the semiconductor die the plurality of bumps 206 is connecting to as well as the available surface area on the semiconductor die (104, FIG. 1). Similar to the plurality of bumps 106 illustrated in FIGS. 1-2B, the plurality of bumps 206 are illustrated in FIGS. 4A-4B as having a tapered shape, whereas, for simplicity, the plurality of bumps 206 are schematically illustrated in FIGS. 4C-4D without the tapered details shown in FIGS. 4A-4B.

With reference now primarily to FIG. 4D, the second plurality of openings 220 are shown via hidden lines; however, a portion of the pre-mold compound 222 that is directly beneath the first plurality of openings 218 is visible. The first plurality of openings 218 align with or are over at least a portion of the second plurality of openings 220 with respect to the z-direction 237. In other words, the first plurality of openings 218 stay within the boundaries of the second plurality of openings 220, as illustrated by the hidden lines demarking opening 220. As one specific example, a first opening 219 of the first plurality of openings 218 is between a first wall 221 and a second wall 223 of a second opening 225 of the second plurality of openings 220.

Figure 5:
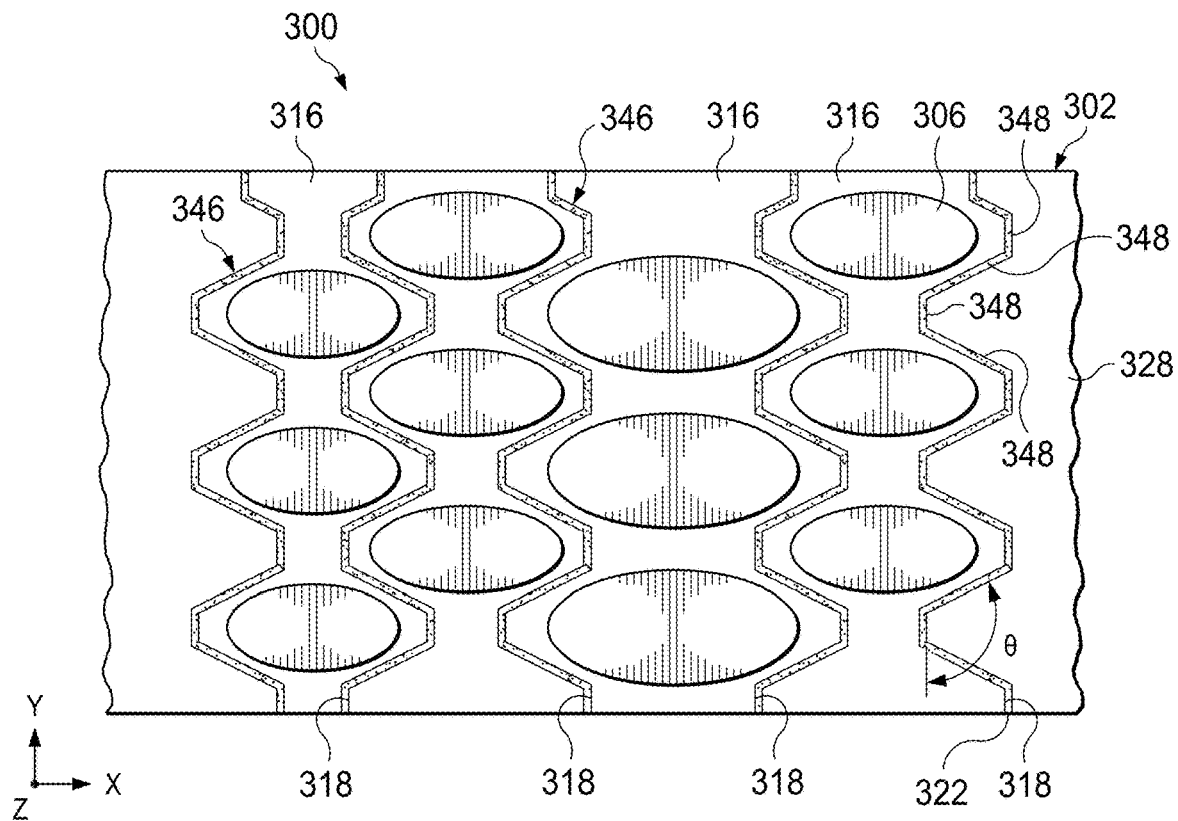
FIG. 5 is a schematic, top view of a portion of an illustrative semiconductor package.

Referring now primarily to FIG. 5, a schematic, top view of a portion of a semiconductor package 300 is presented. The semiconductor package 300 is similar to the semiconductor package 200 illustrated in FIGS. 4A-4D, except for the shape of a cutting pattern 346. The semiconductor package 300 includes a leadframe 302 segmented into a plurality of leadframe leads 316 via at least a first plurality of openings 318 from a first side 328 and the second plurality of openings (analogous to openings 220) from a second, opposing side. The first plurality of openings 318 extends from a first side 328 of the leadframe 302 toward the second side. The second plurality of openings is not shown but would be arranged analogously to the second plurality of openings 220 in FIGS. 4A-4D. A pre-mold compound 322 is positioned in the second plurality of openings and the portion of the pre-mold compound 322 directly under the first plurality of openings 318 is visible in the figure.

The first plurality of openings 318 are arranged according to the cutting pattern 346. The cutting pattern 346 and, thus, the first plurality of openings 318 is overall nonlinear, e.g., having traces out in both the x and y directions at places. In some examples, the first plurality of openings 318 and the cutting pattern 346 include a number of straight segments 348 connected together to form an angle at each segment, for example angle θ. In yet some examples, the first plurality of openings 318 and the cutting pattern 346 is a modified zigzag pattern that extends generally in the direction of the y-axis. While the cutting pattern 346 of FIG. 5 is formed of a number of straight segments 348, in some examples, the cutting pattern 346 also includes curved segments having a rounded profile.

A plurality of interconnect bumps 306 extend from the leadframe 302 towards a die (104 in FIG. 1). In some examples, one or more of the plurality of interconnects bumps 306 extend from each of the plurality of leadframe leads 316. For simplicity, the plurality of interconnect bumps 306 are illustrated as having a simple, elliptical shape with a flat top surface. However, it should be appreciated that in some examples, the plurality of interconnect bumps 306 are tapered or otherwise shaped similar to the plurality of interconnect bumps 106 and 206 disclosed above with regards to FIGS. 1-2B or FIGS. 4A-4D, respectively. The interconnect bumps couple the die and leadframe.

Figure 6:
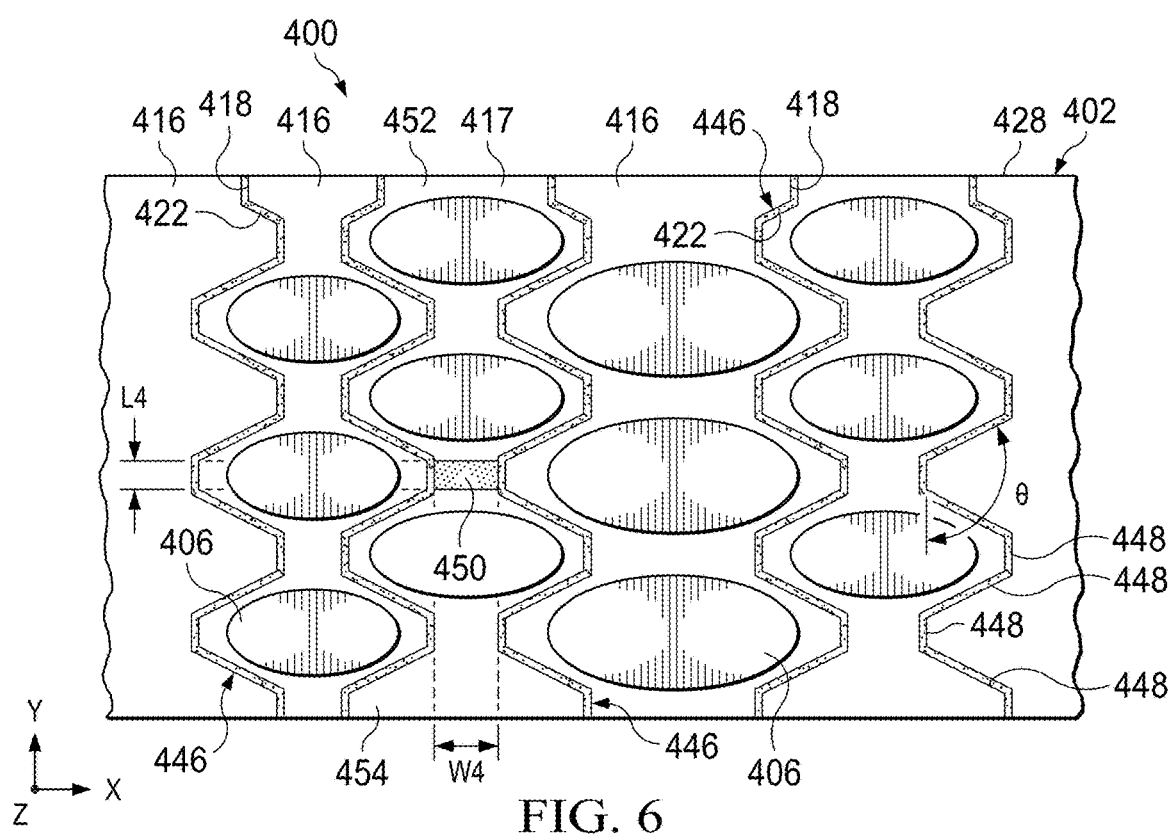
FIG. 6 is a schematic, top view of a portion of an illustrative semiconductor package.

Referring now primarily to FIG. 6, a schematic, top view of a portion of an illustrative semiconductor package 400 is presented. The semiconductor package 400 is similar to the semiconductor package 300 illustrated in FIG. 5, except for aspects of a cutting pattern 446. The semiconductor package 400 includes a leadframe 402 segmented into a plurality of leadframe leads 416 via at least a first plurality of openings 418 from the first side 428 and underlying the second plurality of openings from the second side. One or more of a plurality of interconnect bumps 406 extend from landing sites on each of the plurality of leadframe leads 416. Again, for simplicity, the plurality of interconnect bumps 406 are illustrated as having a simple, elliptical shape with a flat top surface. It should, however, be appreciated that in some examples, the plurality of interconnect bumps 406 are tapered or otherwise shaped similar to the plurality of interconnect bumps 106 and 206 disclosed above with regards to FIGS. 1-2B or FIGS. 4A-4D, respectively. The first plurality of openings 418 extends from a first side 428 of the leadframe 402. The second plurality of openings is not shown but would be arranged similarly to the second plurality of openings 220 in FIGS. 4A-4D. A pre-mold compound 422 is positioned in the second plurality of openings and the portion of the pre-mold compound 422 directly under the first plurality of openings 418 is visible in the figure.

The first plurality of openings 418 are arranged according to the cutting pattern 446. The cutting pattern 446 and, thus, the first plurality of openings 418 are nonlinear along at least one of the horizontal directions, e.g., the y-axis. In some examples, the first plurality of openings 418 and the cutting pattern 446 include a number of straight segments 448 connected together to form an angle, for example angle θ. In yet some aspects, the first plurality of openings 418 and the cutting pattern 446 are a modified zigzag pattern that extends along a horizontal direction, such as the y-axis.

The first plurality of openings 418 and the cutting pattern 446 include a space or gap 450. The space 450 separates one of the plurality of leadframe leads 417 into a first portion 452 and a second portion 454. The leads include bump landing sites for receiving a plurality of bumps. The space 450 extends through (z-direction) the leadframe 402 such that full separation between the first portion 452 and the second portion 454 is achieved. The space 450 is fully separated from the first portion 452 and the second portion 454 in both a vertical direction (z-axis) and a horizontal direction (x-y plane). The space 450 has a lateral width W4, for example along the x-axis, and a longitudinal length L4, for example along the y-axis. In some examples, the width W4 is between approximately 25 and 300 micrometers and the length L4 is between approximately 25 and 300 micrometers. In some examples, the space 450 is formed using a cutting apparatus similar to the cutting apparatus described above with regard to FIGS. 3A-3E. In some examples, the spaces 450 are used to electrically separate (isolate) the two parts of the leadframe; in this way, one can get more pins or I/O (input/output) functionality. The pre-mold compound 422 allows the lead to be supported notwithstanding gap 450.

Figure 7:
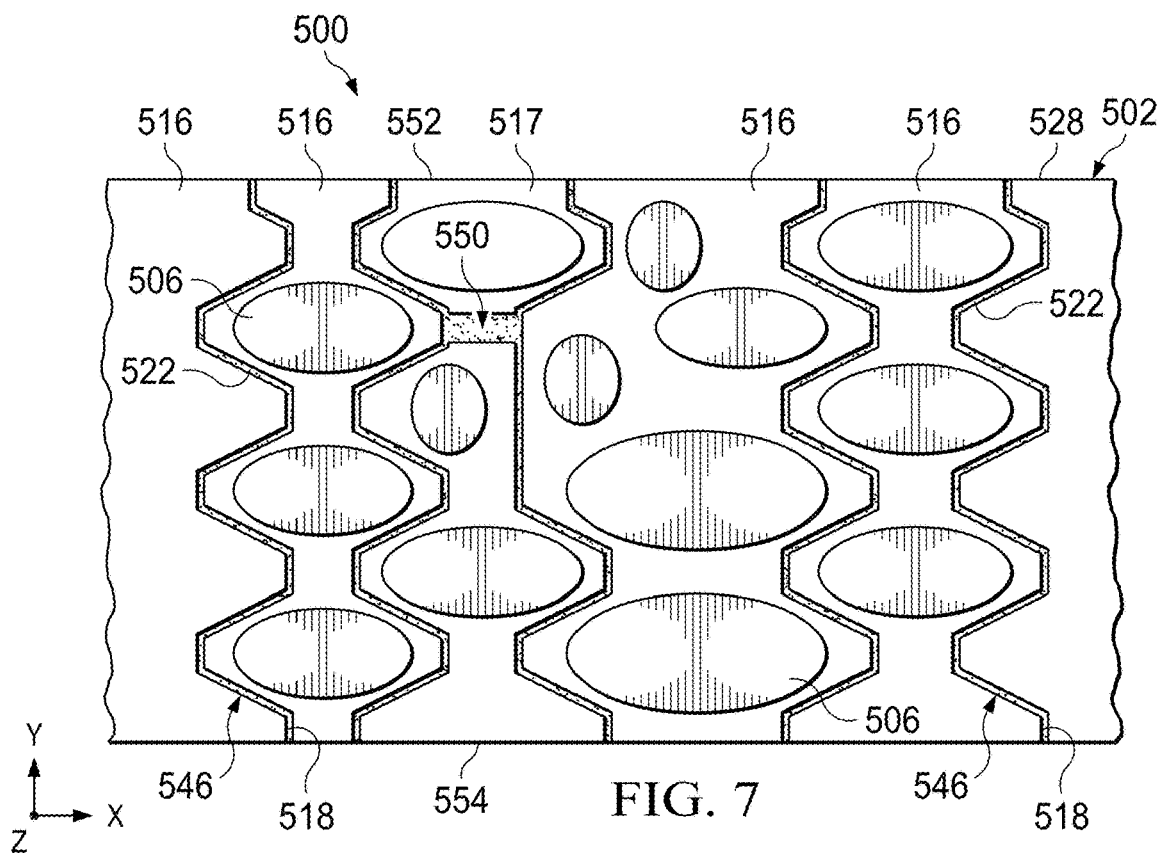
FIG. 7 is a schematic, top view of a portion of an illustrative semiconductor package.

Referring now primarily to FIG. 7, a schematic, top view of a portion of an illustrative semiconductor package 500 is presented. The semiconductor package 500 is similar to the semiconductor package 300 illustrated in FIG. 5 and the semiconductor package 400 illustrated in FIG. 6. The semiconductor package 500 illustrates another aspect of how a cutting pattern 546, a first plurality of openings 518, and a plurality of interconnect bumps 506 may be customized into a number of shapes. The semiconductor package 500 includes a leadframe 502 segmented into a plurality of leadframe leads 516 via at least the first plurality of openings 518 and the underlying second plurality of openings (analogous to openings 220). The second plurality of openings are not shown but would be arranged analogously to the second plurality of openings 220 in FIGS. 4A-4D. It should be appreciated that the first plurality of openings 518 connect to the second plurality of openings as described in previous examples. A pre-mold compound 522 is positioned in the second plurality of openings and the portion of the pre-mold compound 522 directly under the first plurality of openings 518 is visible in the figure.

The first plurality of openings 518 and the cutting pattern 546 include a space or gap 550. In one example, the space 550 separates one of the plurality of leadframe leads 517 into a first portion 552 and a second portion 554. The space 550 extends through (z-direction) the leadframe 502 such that full separation between the first portion 552 and the second portion 554 is achieved. The space 550 is similar to the space 450 described with respect to FIG. 6. The first plurality of openings 518 and the plurality of bumps 506 may be customized in size, shape, position, etc. based on PCB and the semiconductor die configurations. A variety of bumps 506 with varying widths and shapes are shown. For simplicity, the plurality of interconnect bumps 506 are illustrated as having a flat top surface. It should, however, be appreciated that in some examples, the plurality of interconnect bumps 506 are tapered or otherwise shaped similar to the plurality of interconnect bumps 106 and 206 disclosed above with regards to FIGS. 1-2B or FIGS. 4A-4D, respectively.

Figure 8:
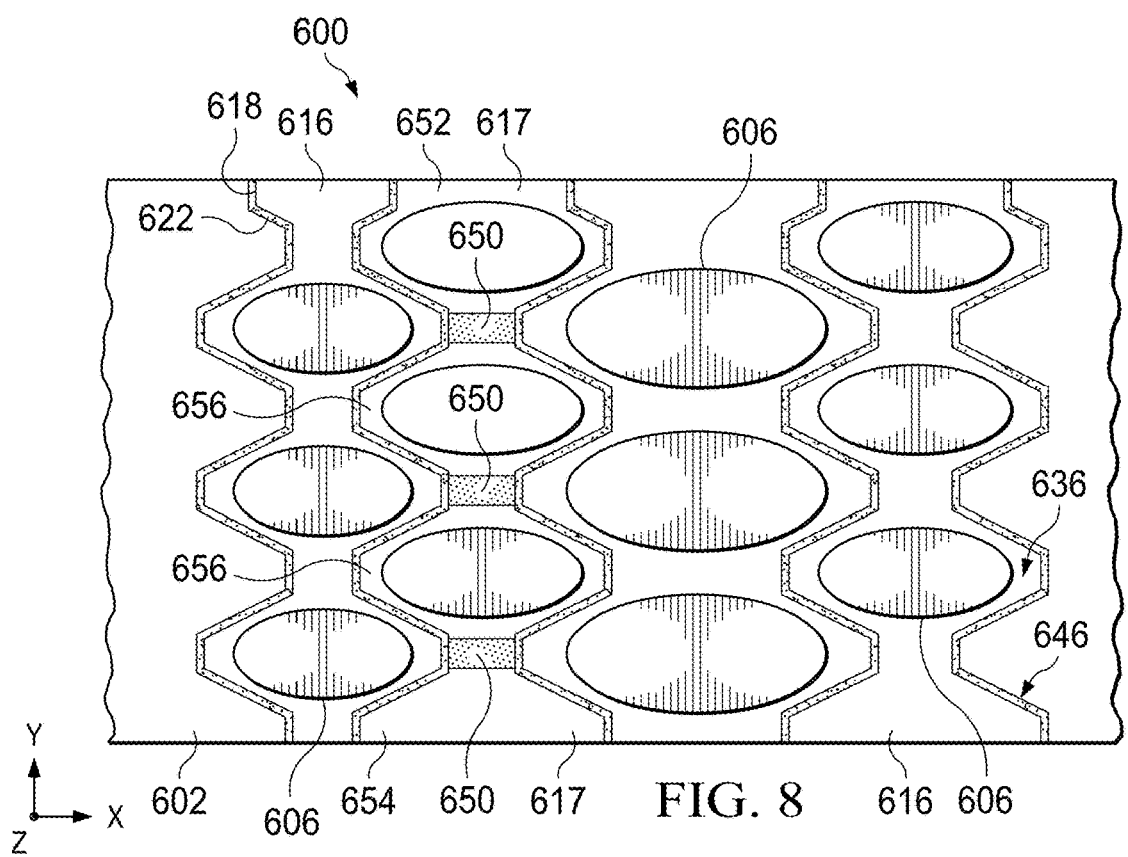
FIG. 8 is a schematic, top view of a portion of an illustrative semiconductor package.

Referring now primarily to FIG. 8, a schematic, top view of a portion of an illustrative semiconductor package 600 is presented. The semiconductor package 600 is similar to at least the semiconductor package 400 illustrated in FIG. 6, except that the semiconductor package 600 includes islands 656 in a leadframe 602. The term "island" is used because the island 656 is isolated from other leads 616 of the leadframe 602 and from the ends and is supported fully by the pre-mold compound 622 as described below.

The semiconductor package 600 includes the leadframe 602 segmented into a plurality of leadframe leads 616 via at least a first plurality of openings 618 formed in the leadframe 602 and a second plurality of openings from the second side (analogous to 220). One or more of a plurality of interconnect bumps 606 extend from landing sites on each of the plurality of leadframe leads 616 towards a die (see 104, FIG. 1). For simplicity, the plurality of interconnect bumps 606 are illustrated as having a simple, elliptical shape with a flat top surface; however, it should be appreciated that in some examples, the plurality of interconnect bumps 606 are tapered or otherwise shaped similar to the plurality of interconnect bumps 106 and 206 disclosed above with regards to FIGS. 1-2B or FIGS. 4A-4D, respectively.

The first plurality of openings 618 extends into the leadframe 602 from a first side 628 of the leadframe 602. The second plurality of openings are not shown but would be arranged analogously to the second plurality of openings 220 in FIGS. 4A-4D. The pre-mold compound 622 is positioned in the second plurality of openings and the portion of the pre-mold compound 622 directly under the first plurality of openings 618 is visible in the figure.

The first plurality of openings 618 are arranged according to a cutting pattern 646. The cutting pattern 646 and, thus, the first plurality of openings 618 are nonlinear overall along at least one of a first direction, e.g., the y-axis. The first plurality of openings 618 is shown forming a zig-zag pattern that forms enlarged landing sites for the interconnect bumps 606. The first plurality of openings 618 and the cutting pattern 646 include a number of spaces or gaps 650. The spaces 650 separate one of the plurality of leadframe leads 617 into a first portion 652, a second portion 654 and one or more of the islands 656, such that the islands 656 are between the first portion 652 and the second portion 654.

The islands 656 are isolated from the plurality of leadframe leads 616, including the first portion 652 and the second portion 654 of the leadframe line 617. The islands 656 are supported by the pre-mold compound 622. The pre-mold compound 622 facilitates the creation of the islands 656 because the islands 656 are isolated from other metal portions of the leadframe 602, e.g., the plurality of leadframe leads 616. In some examples, one or more of the plurality of interconnect bumps 606 are positioned on the islands 656. In yet some aspects, other components, for example a capacitor, are connected to the islands 656. In some examples, the islands 656 are inaccessible or unobservable after final assembly of the semiconductor package 600, which may cause components connected to the islands 656 to be hidden. Any of a number of components may be positioned on the islands 656, e.g., capacitors, inductors, or current sensors. In some aspects, by not exposing all these connections, a good amount of complexity is hidden (or protected) from the user, and by not exposing them, space on the PCB is not wasted.

In some examples, the spaces 650 extend the entire vertical length (e.g., the z-axis extending into the page) of the leadframe 602 such that full separation between the first portion 652 and the second portion 654 is achieved. The spaces 650 and associated adjacent first plurality of openings 618 fully separate the first portion 652, the second portion 654, and the islands 656 in both the x-y plane and the z-direction.

Figure 9A:
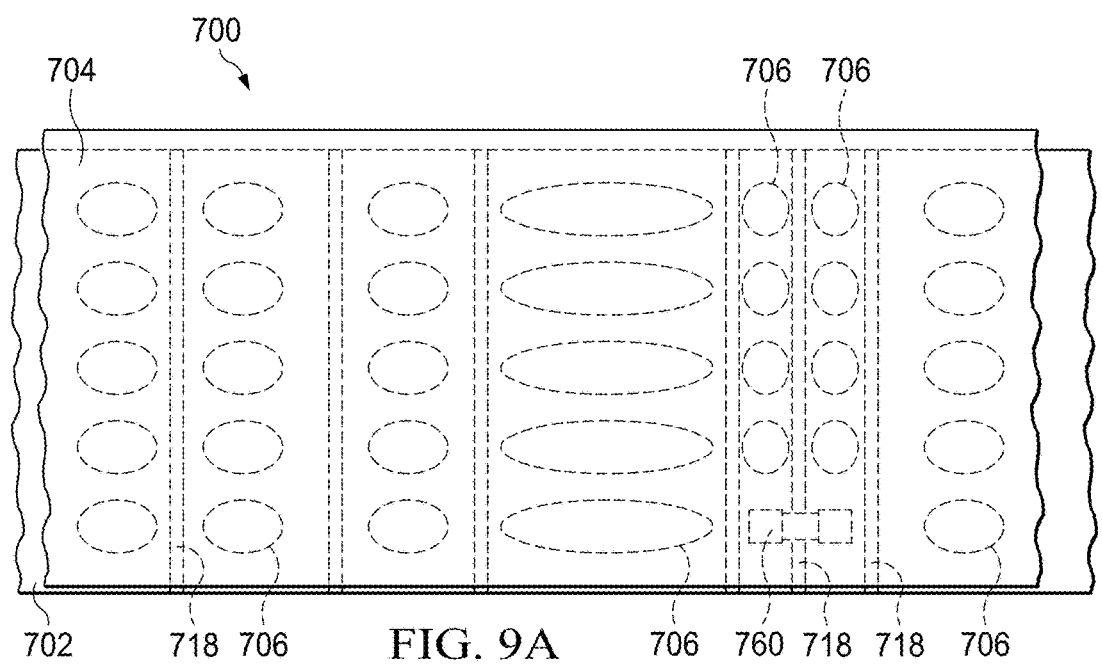
FIG. 9A is a schematic, top view of a portion of an illustrative semiconductor package.
Figure 9B:
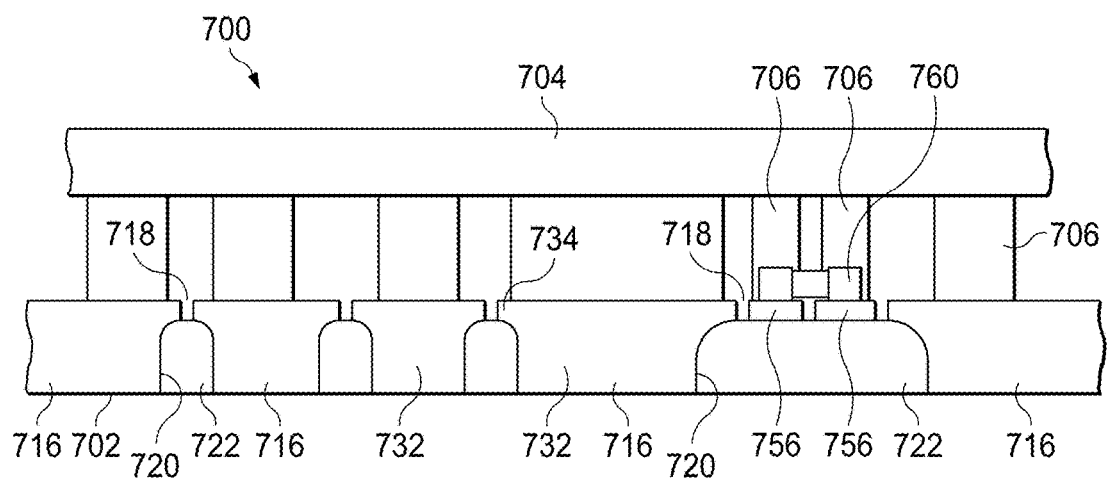
FIG. 9B is a schematic, front view in elevation of the semiconductor package of FIG. 9A.

Referring now primarily to FIGS. 9A-9B, a portion of an illustrative semiconductor package 700 is presented. FIG. 9A is a schematic, top view of the semiconductor package 700, and FIG. 9B is a schematic, front view in elevation of the semiconductor package 700. The over mold compound has been left over for illustrative purposes. The semiconductor package 700 includes a leadframe 702, a semiconductor die 704, and a plurality of bumps 706 that electrically connect the semiconductor die 704 to the leadframe 702. The plurality of bumps 706 are shown having a uniform diameter, but, it should be appreciated that plurality of the bumps 706 are, in some examples, tapered or shaped like the plurality of bumps 106 in FIG. 1-2B or the plurality of bumps 206 in FIGS. 4A-4D, such that the plurality of bumps 706 have a larger diameter connecting to the leadframe 702 and a smaller diameter connecting to the die 704.

The leadframe 702 includes a plurality of leadframe leads 716 for receiving one end of the plurality of bumps 706 on a surface, e.g., landing sites. The plurality of leadframe leads 716 are physically separated from each other and are separated using a first plurality of openings 718 and a second plurality of openings 720. A pre-mold compound 722 is positioned in or otherwise substantially fills the second plurality of openings 720. The plurality of leadframe leads 716 include a full body portion 732 and a cantilevered portion 734 extending laterally from the full body portion 732.

The leadframe 702 further includes a plurality of islands 756 that are supported by the pre-mold compound 722. The plurality of islands 756 are separated from adjacent leadframe leads 716 or each other via the first plurality of openings 718. One difference between the plurality of islands 756 and the plurality of leadframe leads 716 is that the plurality of islands 756 are fully supported by the pre-mold compound 722 because the plurality of islands 756 do not include a full body portion like the plurality of leadframe leads 716 to provide at least some support.

In some examples, the plurality of islands 756 include components positioned thereon, such as a capacitor 760. In one example, the capacitor 760 extends between or forms a bridge across adjacent islands 756. In another illustrative example, other components that are positioned on the plurality of island 756, such as, capacitors, inductors, or current sensors. In some examples, the plurality of islands 756 is hidden after assembly of the semiconductor package 700. In yet some examples, the components positioned on the plurality of island 756, such as the capacitor 760, are also hidden after assembly of the semiconductor package 700.

In some aspects, the pre-mold compound facilitates multi-chip modules (MCM). With an MCM, to increase device functionality, multiple dies (same or different kinds) are placed on the same leadframe next to each other. In such a case, some of the internal connections between the two dies do not need to be exposed and can be on islands, while some are provided for the PCB connections. Moreover, in some aspects, cavities are created to accommodate additional components, e.g., capacitors, inductors, current sensors, temperature sensors, or other components.

In some examples, the leadframe 702 is formed using techniques described above with reference to FIGS. 3A-3E. Because the leadframe 702, in some examples, includes the plurality of islands 756, the cutting of the first plurality of openings 718, at least with regards to the first plurality of openings 718 used to form the plurality of islands 756, occurs after the formation of the second plurality of openings 720 and subsequent to filling of the second plurality of openings 720 with the pre-mold compound 722. The plurality of islands 756 do not have a full body portion like the plurality of leadframe leads 716 to provide support and, thus, need the pre-mold compound 722 to be in place to support the plurality of islands 756 before the plurality of islands 756 may be formed.

Figure 10:
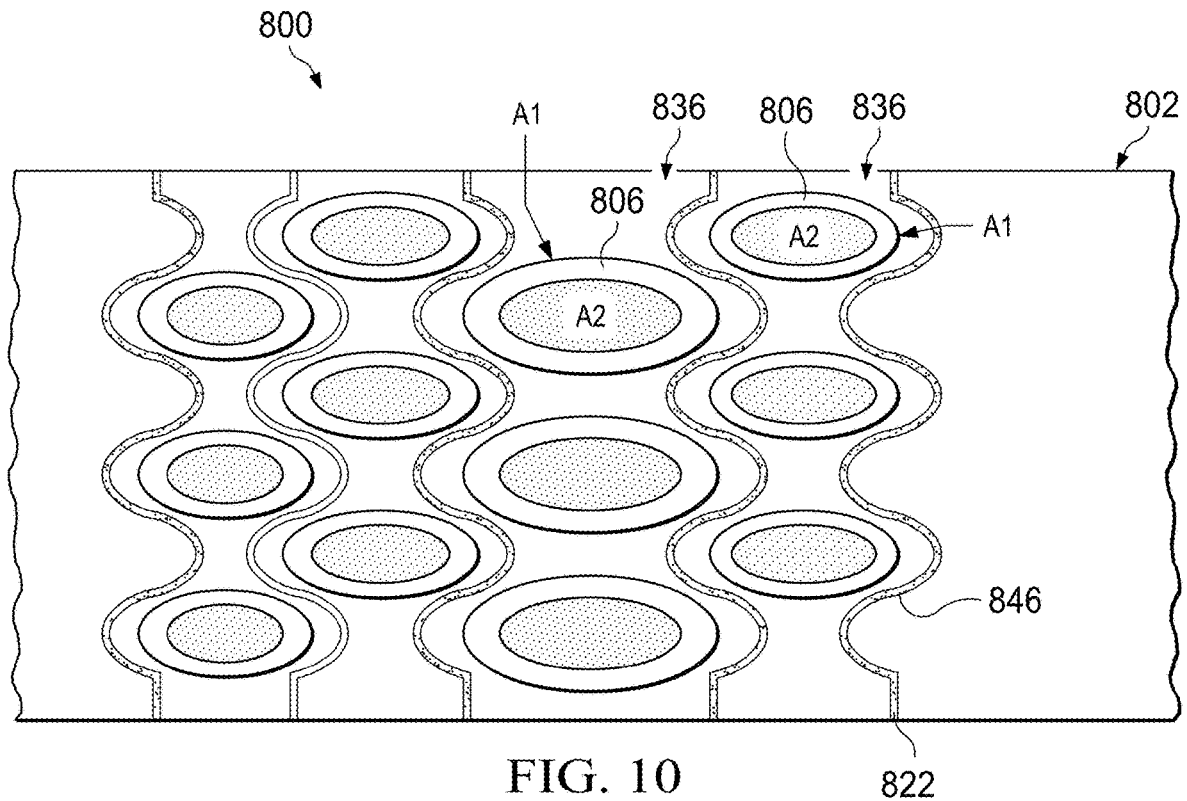
FIG. 10 is a schematic, top view of a portion of an illustrative semiconductor package.

Referring now primarily to FIG. 10, a schematic, top view of a portion of a semiconductor package 800 is presented. The semiconductor package 800 includes a leadframe 802 and a plurality of interconnect bumps 806 extending therefrom. The semiconductor package 800 illustrates how, in some examples, creating a nonlinear first plurality of openings 818 by using a nonlinear, cutting pattern 846 increases a bump landing site area 836 on a first side 828 of the leadframe 802. The lateral cross-sectional surface area A1 (outer ring) of the plurality of interconnect bumps 806 may be increased in this situation. Without the curvilinear portions, the cross-sectional would be limited to A2. For reference, the surface area A2 is superimposed over the surface area A1 of the plurality of bump 806 to show the variation in surface area size had the first plurality of openings 818 been linear such as shown in FIGS. 2A-2B. A1 versus A2 shows the benefit of a non-linear cut. Thus, by modifying the first plurality of openings 818 to be nonlinear or otherwise having a curvature, the surface area A1 of the plurality of bump 806 may be increased from the surface area A1 to the surface area A2 without increases the overall size of the leadframe. In some examples, the surface area A2 is twice that of the surface area A1.

The second plurality of openings are not shown but would be arranged similarly to the second plurality of openings 220 in FIGS. 4A-4D. A pre-mold compound 822 is positioned in the second plurality of openings, and the portion of the pre-mold compound 822 directly under the first plurality of openings 818 is visible in the figure. As previously mentioned, by increasing the landing site area 836 on the leadframe 802 such that the surface area, for example the surface area A1, connected to the landing site 836 can be increased, current and power densities transferred between the plurality of interconnect bumps 806 and the leadframe 802 are decreased, which improves the life and performance of the semiconductor package 800. Moreover, the pre-mold compound 822 may further facilitate a larger landing site area 836 on the first side 828 of the leadframe 802 by providing structural support to the leadframe 802 in a similar manner as described above with reference to FIGS. 1-2B and thus allowing narrower cuts on the first side.

Figure 11:
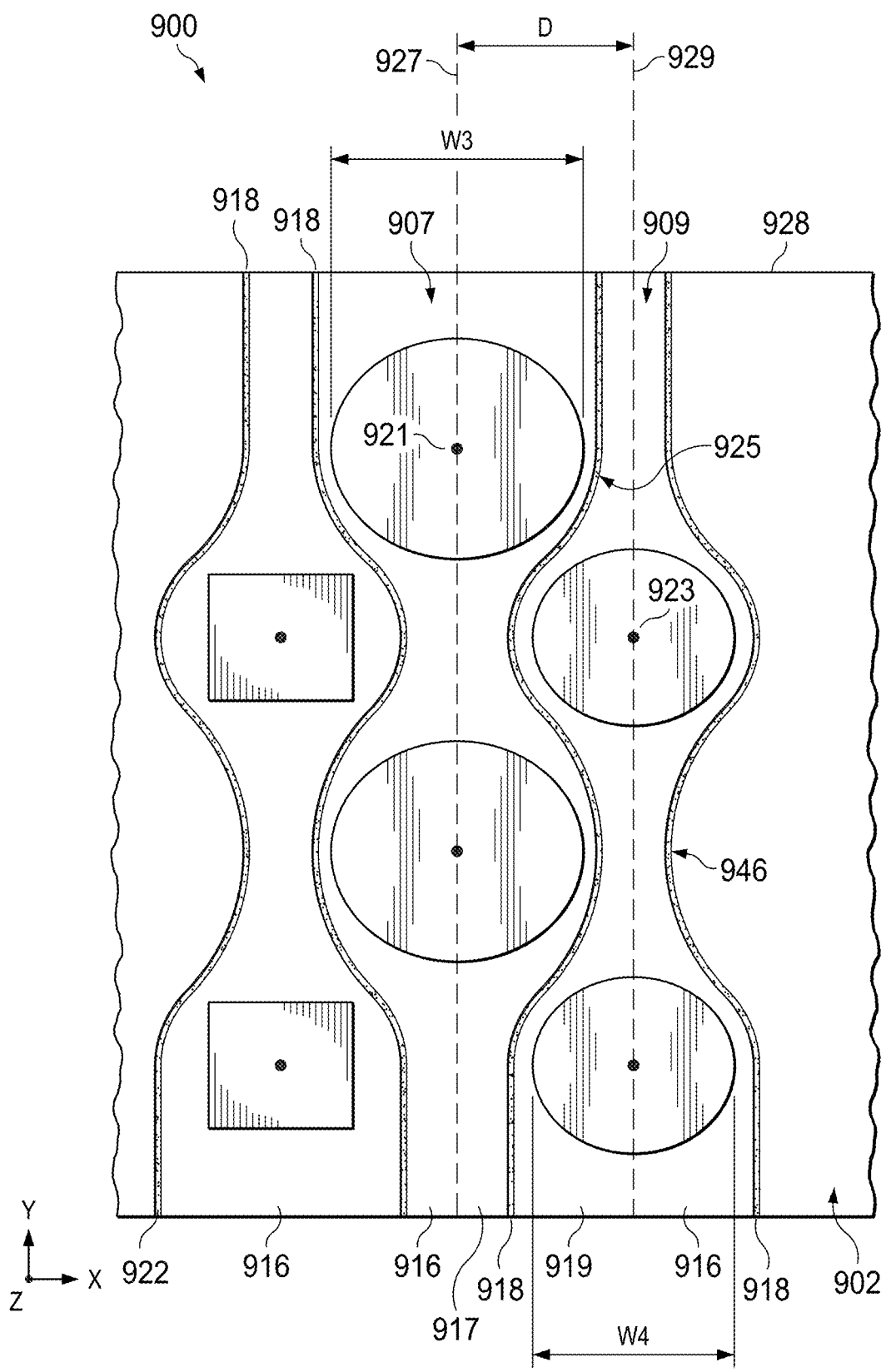
FIG. 11 is a schematic, top view of a portion of an illustrative semiconductor package.

Referring now primarily to FIG. 11, a schematic, top view of a portion of an illustrative semiconductor package 900 is presented. The semiconductor package 900 is similar to the semiconductor package 300 illustrated in FIG. 5 and the semiconductor package 400 illustrated in FIG. 6. The semiconductor package 900 includes a leadframe 902 segmented into a plurality of leadframe leads 916 via at least the first plurality of openings 918 and underlying second plurality of openings (analogous to openings 220). The second plurality of openings is not shown but would be arranged analogously to the second plurality of openings 220 in FIGS. 4A-4D. It should be appreciated that the first plurality of openings 918 would connect to or intersect or be in fluid communication with the second plurality of openings as described in previous examples to form the plurality of leads 916.

The first plurality of openings 918 and the cutting pattern 946 and the plurality of bumps 906 may be customized in size, shape, position, etc. based on PCB and semiconductor die configurations. A pre-mold compound 922 is applied in the plurality of second openings to provide support to the plurality of leads 916 and to form islands (see 656, FIG. 8) as desired.

A plurality of power bumps 907 and a plurality of signal bumps 909 are coupled to the first side 928 and extend between the first side 928 (with solder also on that end; see 112 in FIG. 1) to sites on a die (not explicitly shown but analogous to 104 in FIG. 1). While bumps 907, 909 may vary in size amongst the groups, for explanation of how the density of bumps may be increased, assume that that each of the plurality of power bumps 907 has a width W3, which in this case is a diameter since the bumps 907 have circular cross sections at the first end. It should, be understood, that any shape might be used as previously suggested and, in this regard, a square cross section is shown on the two on the left (for orientation shown). In other examples, other sized bumps are used in a variety of widths depending on the functionality of the bumps.

Likewise, the plurality of signal bumps 909 may be assumed to have a width W4, which in this example is a diameter. Because they are not carrying power, the signal bumps 909 are smaller in lateral width (e.g., diameter) than the power bumps 907, i.e., W3>W4. Moreover, because the first openings 918 are non-linear, e.g., curved, curvilinear, patterned, sinusoidal, or otherwise shaped, the pattern allows an intermeshing of the power bumps 907 and signal bumps 909; this means if one were to view along the surface of the first side 928 along a lead such as the middle lead 916, the power bumps 907 and signal bumps 909 would appear to overlap (see by analogy the apparent overlap 245 in FIG. 4B).

In one example, at least one of the plurality of power bumps 907 is on a first lead 917 of the plurality of leads 916, which is adjacent to a second lead 919 of the plurality of leads 916. A least one of the plurality of signal bumps 909 is on the second lead 919. A center 921 of the at least one of the plurality of power bumps 907 on the first lead 917 is separated orthogonally from a center 923 of the at least one of the plurality of signal bumps 909 by a distance D. The distance orthogonally separating the bumps means the distance between a longitudinal axis 927 (generally along the lead) of the power bump 907 and the longitudinal axis 929 of the signal bump 909. Half of the width of the power bump 907 and half of the width of the signal bump 909 combined are greater than the distance, D, separating the centers, i.e., ((½*W3)+(½*W4))>D. Yet, they fit because the first opening 918 is patterned to go around the power bump 907 and then move inward (toward center as shown) at 925 to go around the signal bump 909 before going outward around the next power bump.

Figure 12:
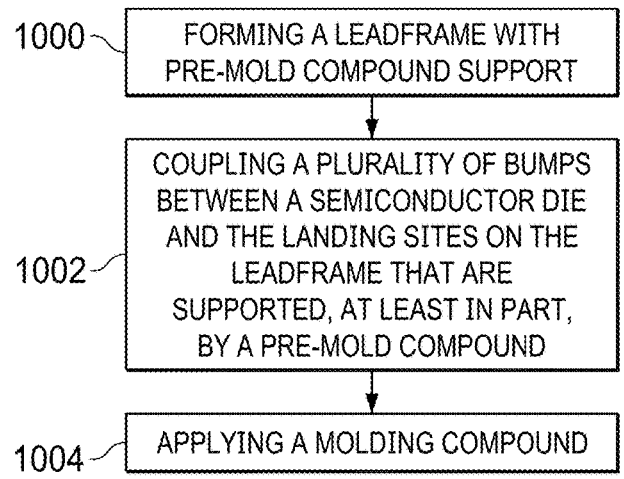
FIG. 12 is an illustrative method of forming a semiconductor package.

Referring now primarily to FIG. 12, another illustrative example that includes a method for fabricating a semiconductor package including a pre-mold compound is presented. The method includes forming a leadframe of the types presented above and then completing the package. Thus, in step 1000, a leadframe (e.g., 102, FIG. 1-3; 202, FIG. 4; 302, FIG. 5; 402, FIG. 6; 502, FIG. 7; 602, FIG. 8; 702, FIG. 9; 802, FIG. 10; 902, FIG. 11) consistent with the examples above is formed. The leadframe has a pre-mold compound (122, 222, 322, 422, 522, 622, 722, 822, 922) in a second plurality of openings for at least partially supporting leads of the leadframe. In addition, the leadframe, in some examples, has overlapping bump landing sites; that is the bump landing sites or bumps when applied appear to overlap (see 245 in FIG. 4B) when viewed from an end (end view). At step 1002, a plurality of bumps are coupled between a semiconductor die (104, FIG. 1) and the bump landing sites (e.g., 136, FIG. 1) on a plurality of leads (e.g., 116, FIG. 1) on the leadframe. It will be understood that this includes solder 112 (FIG. 1). The method also includes applying a molding compound (e.g., 114, FIG. 1) to cover at least a portion of the leadframe and bumps at step 1004.

In one example, a desire to interconnect a semiconductor die to a leadframe while increasing the connection interface on the leadframe and reducing the interconnection area on the die is accomplished. The interconnection is done with a plurality of bumps that have a wide lateral base on the side that interconnects on the leadframe and has a smaller lateral end base at the point of interconnection on the die. While they could take any number of different cross-sections (lateral cross section)—circular, oval, square, triangle, polygon, and the like—the overall longitudinal profile is tapered to go from the larger base to a narrower base. In order to accommodate the larger base on the leadframe side, the bump landing sites are made larger by allowing them to overlap as it appears from looking at it on an end (end view; 245 in FIG. 4B). If one looks at it from a point of reference that is along a top surface—eye adjacent to the surface—of the leadframe, the bumps will appear to intermesh or overlap (see 245 in FIG. 4B). When viewed, however, from the top, one sees that the top openings, which separate the leadframe into different leads, form a pattern that weaves in and out on an x-y plane of the leadframe so that the bases of each bump are in fact separated from one another but appear to overlap from the edge (end view).

Many different patterns might be formed for the first openings that shape the leads such as zigzag, sinusoidal, orthogonal or angled turns. In order to make the pattern, two things are done in one example. A bottom opening or channel or space is formed that is somewhere about 50% to 90% of the otherwise thickness of the leadframe thickness, and then, on top of that—from the top surface—a precise cut is made with a pattern. That precise cut is done with precise equipment such as a laser or water jet or precise mechanical cut. The precise cut can be done with a programmed pattern as one skilled in the art would understand. This precision cut from the top allows the pattern to accommodate the larger bases of the plurality of bumps. In one example, the pattern initially goes straight (parallel to the leads) for a distance and then the non-linear pattern begins. Because the precision cut is made on the top surface over a wider opening that was formed on the bottom surface, the leads are formed and are isolated.

In one aspect, even narrower cuts for the first openings or islands on leads may be formed by putting a support compound or pre-mold compound into the second openings. The pre-mold compound supports at least partially the plurality of leads. In that way, the thickness of the leads need not carry all the structural strength and so the width can be smaller and the second openings can also be deeper.

The meaning of terms used herein should be clear from the foregoing, but in addition, the following amplifications are provided. "Bumps," which are also known as posts or pillars, are a type interconnect between a die and leadframe. Example bumps are presented above as 106, 206, 506, 606, 907, and 909. "Bump landing sites" or "landing sites" on the leads are portions on the surface of a lead sized to receive an end or base of a corresponding bump to form a connection on a surface of a lead. Examples of bump landing sites 136 are shown on at least some of the leads, e.g., landing sites 136. All the top views of the bumps 106, 206, 506, 606, 907, and 909 are on bump landing sites on the leadframe. In one example, the bump landing site is a location on a lead that is intended to receive a bump to form an interconnection. "Chemical etch" is a way of using etching chemicals to remove all or a portion of metal in a selected, unprotected location. "Curvilinear" means formed at least in part with curved boundaries or lines. An example of curvilinear is the curving patterns shown in FIG. 9. "Cutting pattern" means a pattern for a cutting device to trace out a cut; in one instance, the cutting pattern is saved in memory.

"First plurality of openings" herein refers to openings made by the precision cut device from a first surface of a metal strip and at least partially over a second plurality of openings to form a combined opening through the metal strip. "Fluid communication" between two portions means that there is an opening between them that allows fluid (e.g., air) to flow between them. If a space on the bottom (for the orientation shown) intersects a space on the top so that the two are in fluid communication, it means the two spaces form one space that includes both the top and bottom spaces. "Leadframe" is a metal frame that provides external electrical connection to the packaged chip or semiconductor device. Examples from above include 101, 202, 302, 402, 502, 602, and 902. "Leads" of the leadframe are the lengthwise members on which, at least in some examples, bumps are attached. Examples from above include 116, 216, 316, 416, 516, 517, and 916. "Metal strip" means an alloy, e.g., copper alloy, or metal from which a leadframe is formed. An example from above is metal strip 138.

"Molding compounds" are epoxy resins as part of semiconductor package. The resins are at times filled with some sort of silica filler to reduce the coefficient of thermal expansion to better match that of the lead frame along with small amounts of other additives. An example from above is molding compound 114. "Nonlinear from a top view" or plan view with respect of openings in the metal strip of the leadframe means that as one views the metal strip from above the surface (e.g., like in FIG. 4C) one sees that the openings are substantially curvilinear or containing overall non-linear segments; all the openings from the top view in FIG. 4C are examples. "Non-linear portions" refers to portions that are other than linear, e.g., curvilinear.

"Photoresist pattern" is a pattern or image that is used to activate portions of a photoresist layer. "Semiconductor die" is the semiconductor chip with a function circuit or device. An example from above is the die 104 in FIG. 1. "Semiconductor package" is the semiconductor die after interconnecting with leadframe and being at least partially covered with a molding compound. An example from above is semiconductor package 100. "Opening" means a void or location where material has been removed or not formed.

With respect to the expression "each of the plurality of first bumps including a lateral cross-sectional area larger than a lateral cross-sectional area of each of the second plurality of bumps on a given cross-sectional plane of the semiconductor package," an example is clear from FIG. 4B. An example of a given cross-sectional plane 207 of the semiconductor package is shown in broken lines as it intersects a first bumps 209 of the plurality of first bumps and one of the second bumps 211 of the plurality of second bumps. It is apparent that the cross sectional area of the first bump 209 for a lateral cut along plane 207 would be larger than the cross sectional area for a lateral cut along plane 207 of the second bump 211. The cross-sectional area refers to the area of the resultant shape when you make a cut in cross section—e.g. a lateral cut on a longitudinal object; thus, a lateral cross sectional area of a cylinder would be a circle. In one example, the larger first bump 209 is a power bump and the smaller second bump 211 is a signal bump.

With respect to the expression "at least one of the first plurality of bumps overlap," as viewed from an edge or end view, means that when one looks along a lead from an end—like the view of FIG. 4B—one will see bumps that appear to overlap (245 in FIG. 4B). If one lighted the bumps from that angle (along a lead and along a surface of the metal strip) to make a projected silhouette, at least two adjacent bumps (209, 211) would appear in the silhouette as partially merged.

With respect to the expression "cutting a first side of a metal strip to a depth D1 . . . to form a first plurality of openings extending on the first side, wherein the depth D1 is less than a height H3 of the metal strip," what is meant is that, in one example, the depth of the cut to make the first openings that starts on the first side of the metal strip and moves towards the second side is a distance D1 but that is not all the away through the metal strip, which has a thickness or width or height of H3. H3 is between the first surface and the second surface. The cut from the first side is to a depth of D1 to make the first openings. The second openings are from the second side, and the second openings involve material removed or not formed between the second side in the direction of the first side to a depth of D2. If, as is contemplated, D1+D2=H3, then a complete opening or space through the metal strip has been formed.

Modifications are possible in the described arrangements, and other arrangements are possible, within the scope of the claims.

What is claimed is:

1. A method for forming a semiconductor package, the method comprising:
   cutting a first side of the metal strip to a first depth according to a cutting pattern to form a plurality of first channels, wherein the first depth is less than a vertical thickness of the metal strip; a second side of the metal strip, opposing the first side, including a second plurality of channels filled with a first mold compound, the second plurality of channels including a second depth less than the vertical thickness of the metal strip;
   coupling a plurality of bumps of a semiconductor die to the first side of the metal strip; and
   covering at least a portion of the semiconductor die and at least a portion of the metal strip with a second molding compound, wherein the cutting pattern is non-linear.

2. The method of claim 1, wherein, prior to coupling, etching the second side of the metal strip to the second depth according to a photoresist pattern to form the second plurality of channels.

3. The method of claim 1, wherein the vertical thickness of the metal strip is between the first side and the second side of the metal strip.

4. The method of claim 1, wherein the plurality of bumps are aligned in multiple rows, at least two of the plurality of bumps, each from different but adjacent rows of the multiple rows overlap with each other from a side view of the semiconductor package.

5. The method of claim 1, wherein the second depth is more than the first depth.

6. The method of claim 1, wherein the cutting of the first side of the metal strip includes using a laser, a precision water jet, or a plasma cutter.

7. The method of claim 2, wherein the cutting pattern aligns at least partially with the photoresist pattern.

8. The method of claim 2, wherein the etching from the second side continues until 50 to 80 percent of the vertical thickness of the metal strip.

9. The method of claim 1, wherein the cutting of the first side of the metal strip includes forming a cut with a lateral width that is less than 50 microns.

10. The method of claim 1, wherein the photoresist pattern is substantially linear.

11. The method of claim 1, wherein the first plurality of openings and the second plurality of openings together separate a plurality of leads of the metal strip.

12. A method of forming a semiconductor package, the method comprising:
    providing a metal strip having a first side and a second side, wherein the second side is opposed to the first side, and wherein the metal strip has a vertical thickness H between the first side and the second side;
    cutting the first side of the metal strip to a depth D1 according to a cutting pattern to form a first plurality of openings, wherein D1 is less than the vertical thickness H;
    applying a photoresist on the second side of the metal strip;
    applying a chemical etch to the second side of the metal strip according to a photoresist pattern to form a second plurality of openings, wherein a depth D2 of the second plurality of openings is less than the vertical thickness H of the metal strip;

removing the photoresist from the second side of the metal strip;

applying an insulating material into the second plurality of openings;

coupling a plurality of bumps between a semiconductor die and a plurality of bump landing sites on the plurality of leads of the leadframe; and covering at least a portion of the semiconductor die and at least a portion of the leadframe with a molding compound to form the semiconductor package.

13. The method of forming a semiconductor package of claim 12, wherein the plurality of bumps are aligned in multiple rows, at least two of the plurality of bumps, each from different but adjacent rows of the multiple rows overlap with each other from a side view of the semiconductor package.

14. The method of forming a semiconductor package of claim 12, wherein the chemical etch is applied until the depth D2 of the second plurality of openings is 50 to 80 percent of the vertical thickness H1 of the metal strip.

15. The method of forming a semiconductor package of claim 12, wherein cutting the first side of the metal strip includes using a laser, a precision water jet or a plasma cutter.

16. The method of forming a semiconductor package of claim 12, wherein applying the insulating material into the second plurality of openings comprises substantially filling the second plurality of openings with the insulating material.

17. The method of forming a semiconductor package of claim 12, wherein cutting the first side of the metal strip includes forming a cut with a lateral width W1 that is less than 50 microns.

18. The method of forming a semiconductor package of claim 12, wherein the insulating material is a molding compound.

19. The method of forming a semiconductor package of claim 12, wherein cutting the first side comprises fully separating a portion of the metal strip into an isolated island of the semiconductor package.

20. The method of forming a semiconductor package of claim 12, wherein the cutting pattern is non-linear from a top view of the semiconductor package.

21. The method of forming a semiconductor package of claim 12, wherein the cutting pattern includes substantially a sinusoidal pattern.

* * * * *